(12) United States Patent
Shinozuka et al.

(10) Patent No.: US 6,447,632 B1
(45) Date of Patent: Sep. 10, 2002

(54) APPARATUS AND NOZZLE DEVICE FOR GASEOUS POLISHING

(75) Inventors: Shyuhei Shinozuka, Atsugi; Kaori Miyoshi, Fujisawa; Akira Fukunaga, Chigasaki, all of (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 09/272,170

(22) Filed: Mar. 18, 1999

(30) Foreign Application Priority Data

| Mar. 18, 1998 | (JP) | ............................................ | 10-089360 |
| Mar. 18, 1998 | (JP) | ............................................ | 10-089361 |
| Mar. 18, 1998 | (JP) | ............................................ | 10-089519 |
| Mar. 18, 1998 | (JP) | ............................................ | 10-089520 |

(51) Int. Cl.$^7$ ................................................. C23F 1/02
(52) U.S. Cl. ........................................ 156/345; 118/715
(58) Field of Search ..................... 156/345; 216/88–90; 438/692, 693; 118/678, 715; 451/165, 287; 204/298.07, 298.11, 298.33

(56) References Cited

U.S. PATENT DOCUMENTS

| 3,803,380 | A | * | 4/1974 | Ragaller | ................. | 219/121.47 |
| 5,047,612 | A | * | 9/1991 | Savkar et al. | ........... | 219/121.47 |
| 5,322,568 | A | * | 6/1994 | Ishihara et al. | .............. | 118/715 |
| 5,951,769 | A | * | 9/1999 | Bernard et al. | .............. | 118/718 |
| 6,024,829 | A | * | 2/2000 | Easter et al. | ................. | 156/345 |
| 6,059,940 | A | * | 5/2000 | Nogami et al. | ......... | 204/192.15 |

FOREIGN PATENT DOCUMENTS

| JP | 10060673 | * | 3/1998 |
| JP | 10-242129 | | 9/1998 |

OTHER PUBLICATIONS

P.B. Mumola et al., Hughes Danbury Optical Systems, Inc., Semiconductor World 1994.4, pp. 66–67, Apr. 1994.

New U.S. Patent Application filed Mar. 18, 1999, entitled "GAS POLISHING APPARATUS AND METHOD", to Shyuhei Shinozuka et al., Attorney Docket No. 1213/GEB822US.

New U.S. Patent Application Filed Mar. 18, 1999, entitled "GAS POLISHING METHOD AND APPARATUS", to Kaori Miyoshi et al., Attorney Docket No. 1213/GEB823US.

* cited by examiner

*Primary Examiner*—Gregory Mills
*Assistant Examiner*—Luz Alejandro
(74) *Attorney, Agent, or Firm*—Wenderoth, Lind & Ponack, L.L.P.

(57) ABSTRACT

A gaseous polishing apparatus and a nozzle device designed for gaseous polishing perform precision polishing on a surface of an object to be polished. The nozzle device includes a nozzle body having a nozzle opening provided at a downstream end thereof for ejecting polishing gas. A shutter device is disposed in proximity to the nozzle opening so as to control ejecting and stopping of the polishing gas towards the object surface. A control mechanism controls opening and closing action of the shutter device.

21 Claims, 44 Drawing Sheets

F I G. 5A
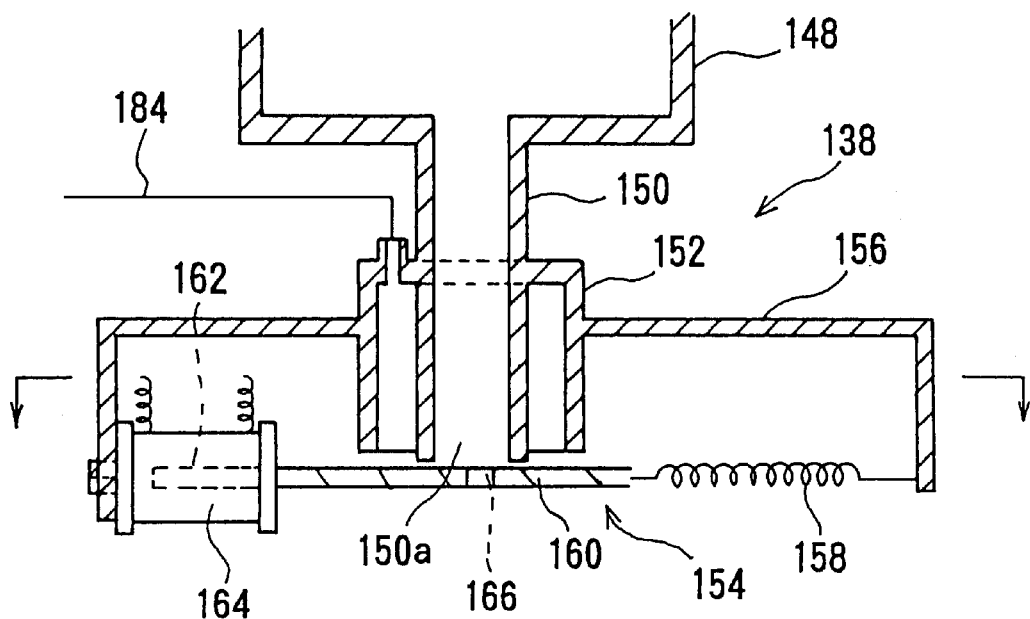
F I G. 5B
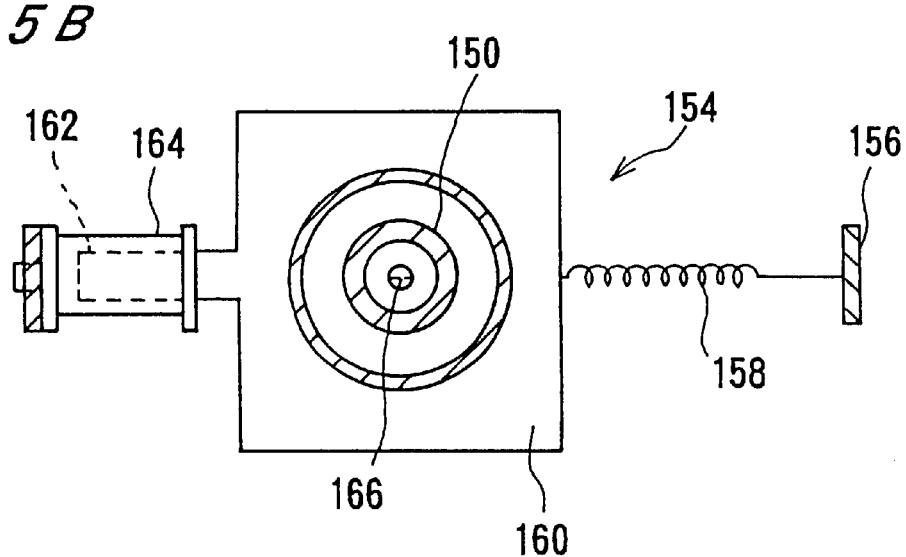

F I G. 6A
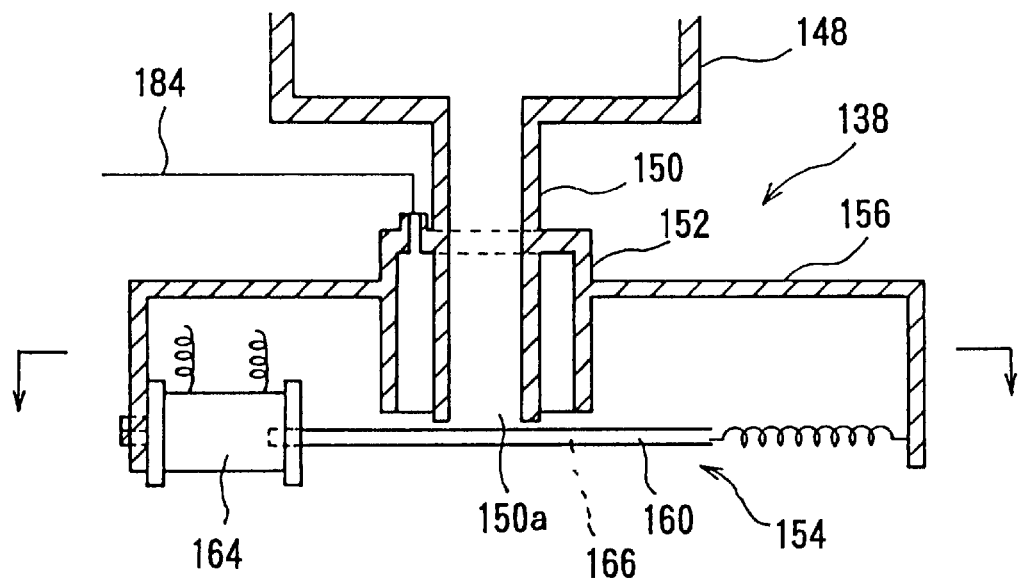
F I G. 6B
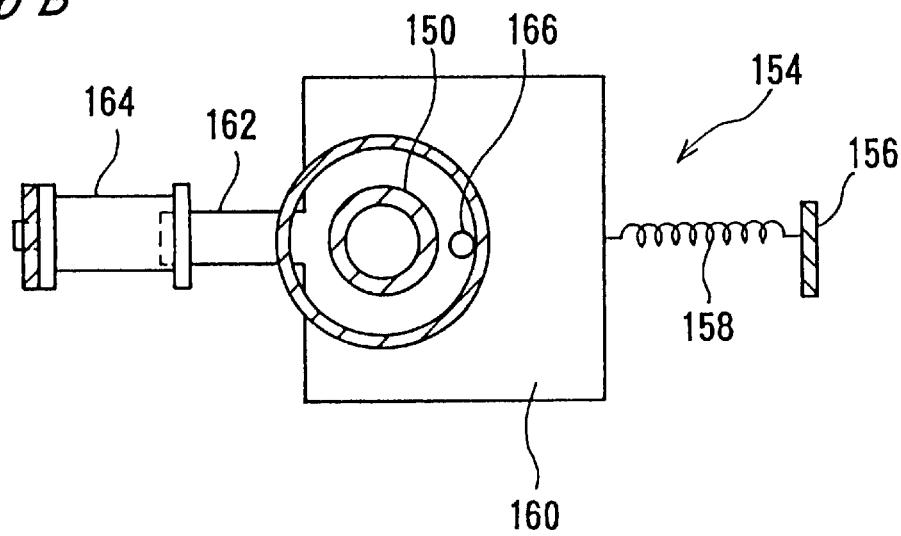

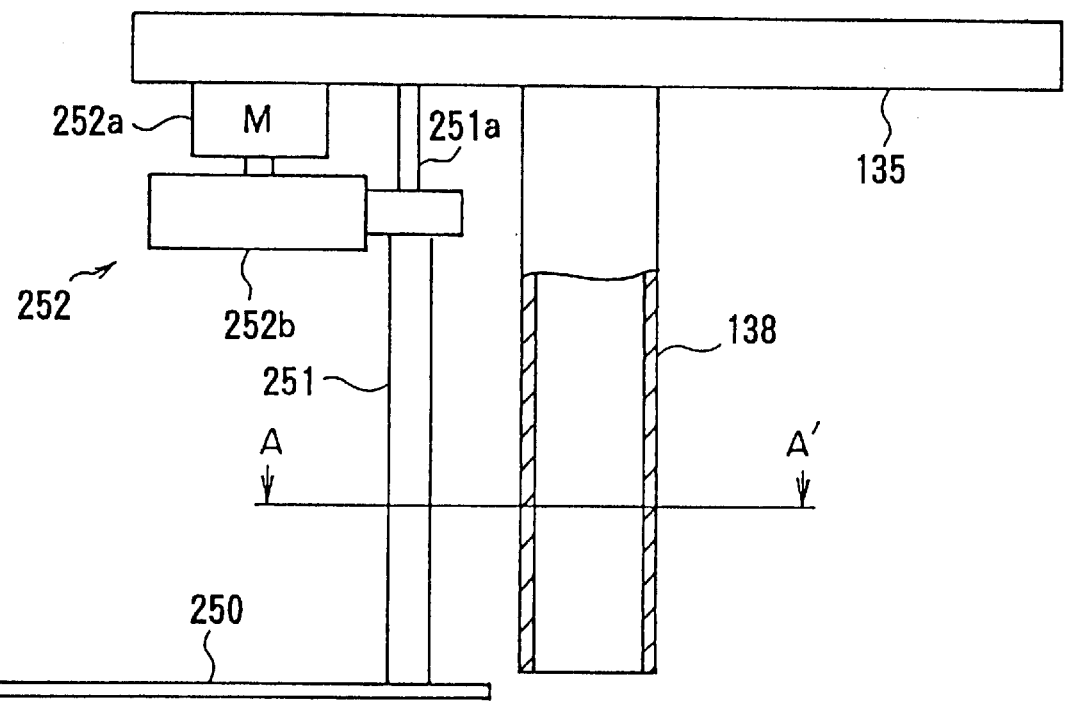
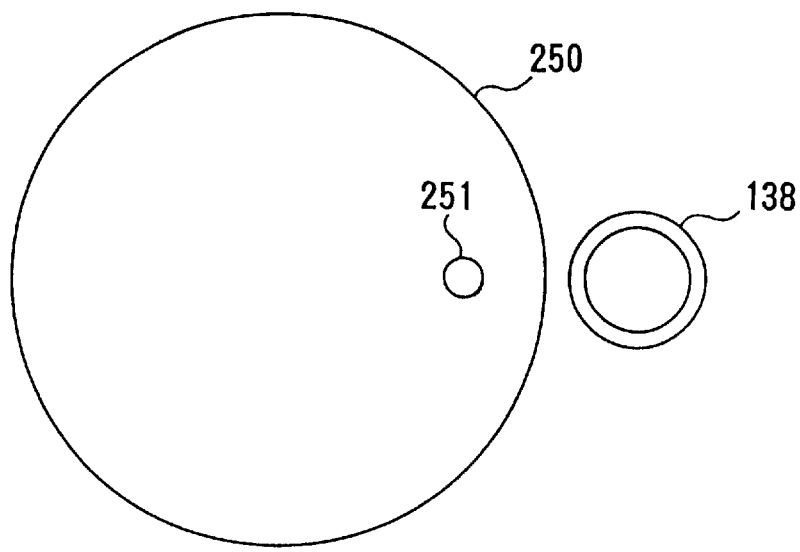

F I G. 1 5 A
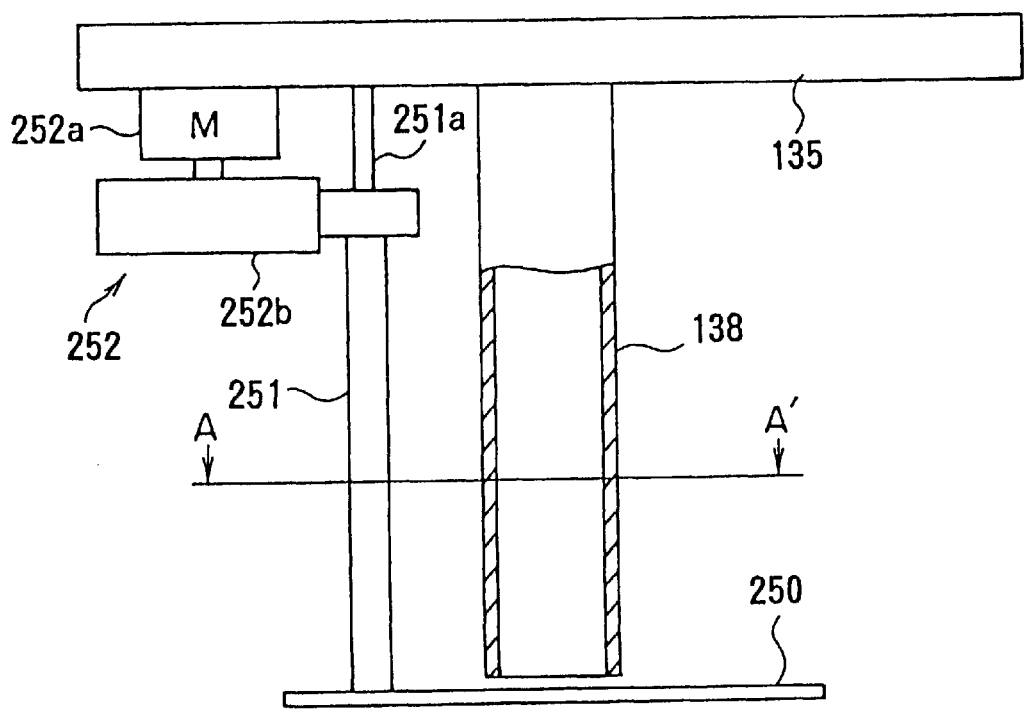
F I G. 1 5 B
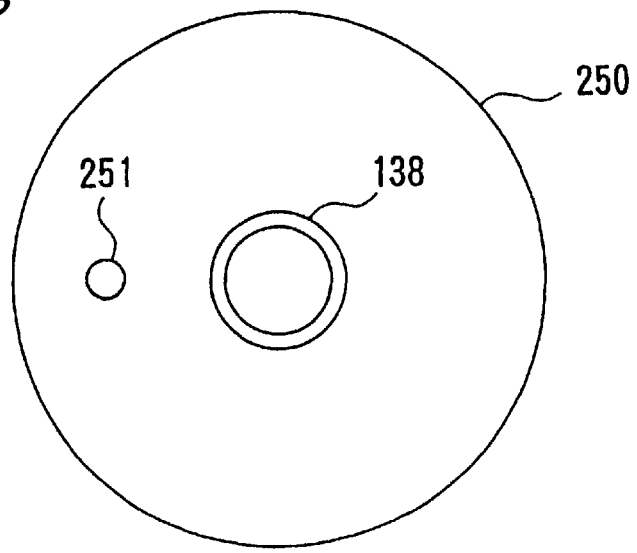

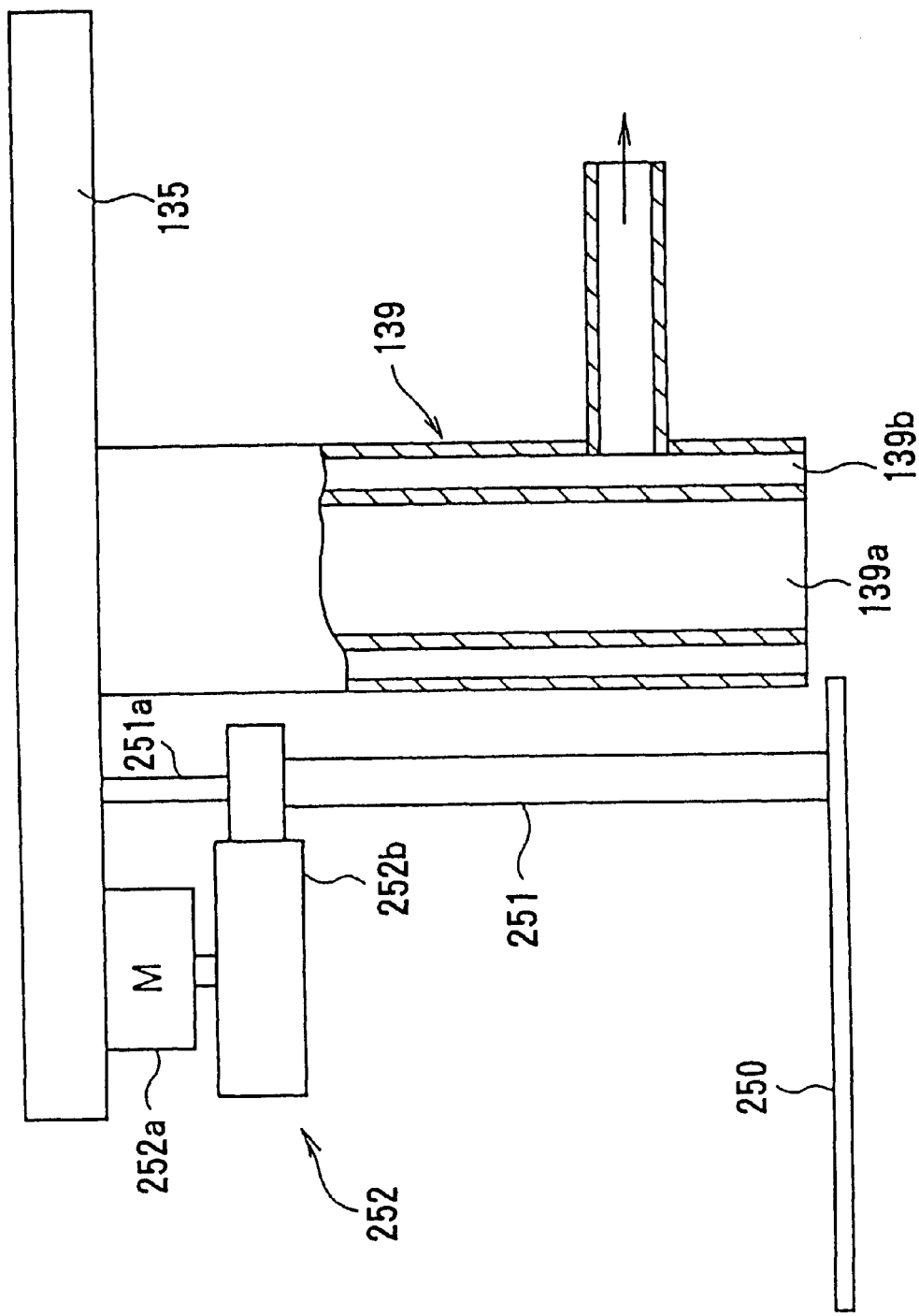

Polishing Profile

FIG. 26

| Item | Content |
|---|---|
| Polishing Object | Poly-Si |
| Gas Composition | $ClF_3 : Ar = 1 : 2$ |
| Amount of gas | 90cc |
| Polishing time | 0.6s |
| Nozzle distance | 1mm |
| Nozzle diameter | 1/4 inch |
| Temperature of Polishing object | 50°C |
| Exhaust Speed | about 1000 l/min |
| Depth of gaseous polishing | about 1000 Å |

Example of Polishing Condition

F I G. 32
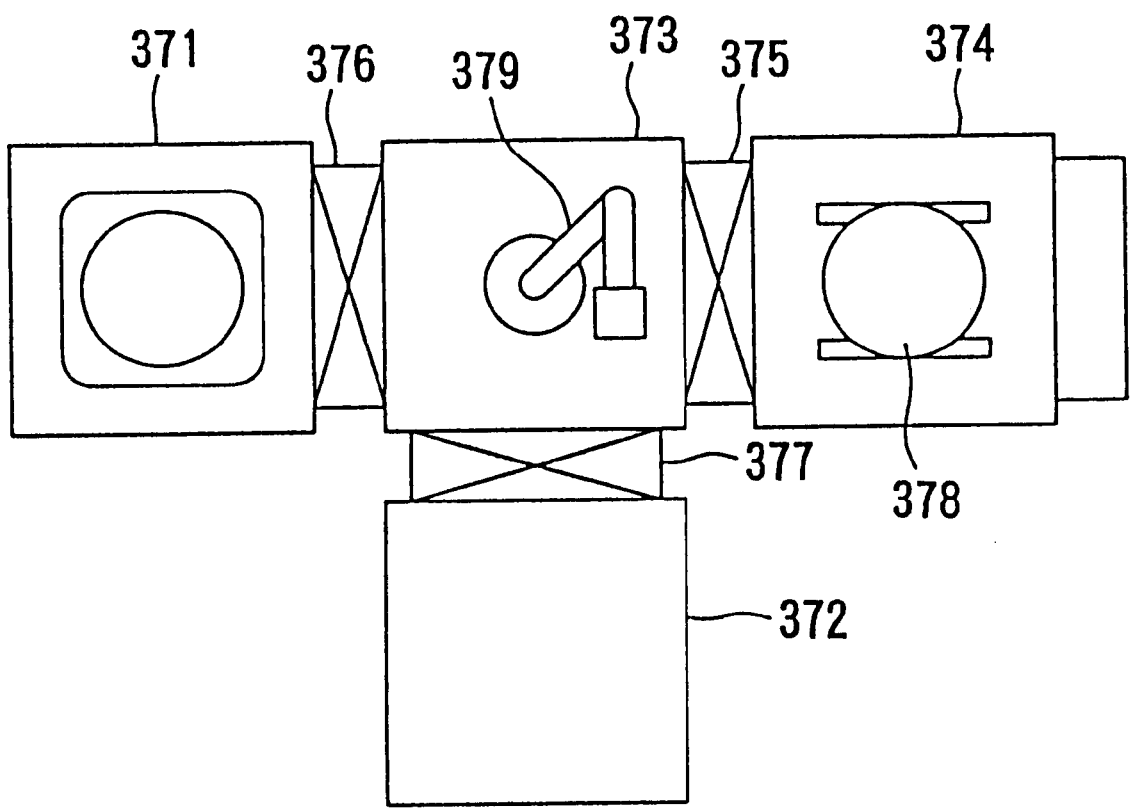

F I G. 36
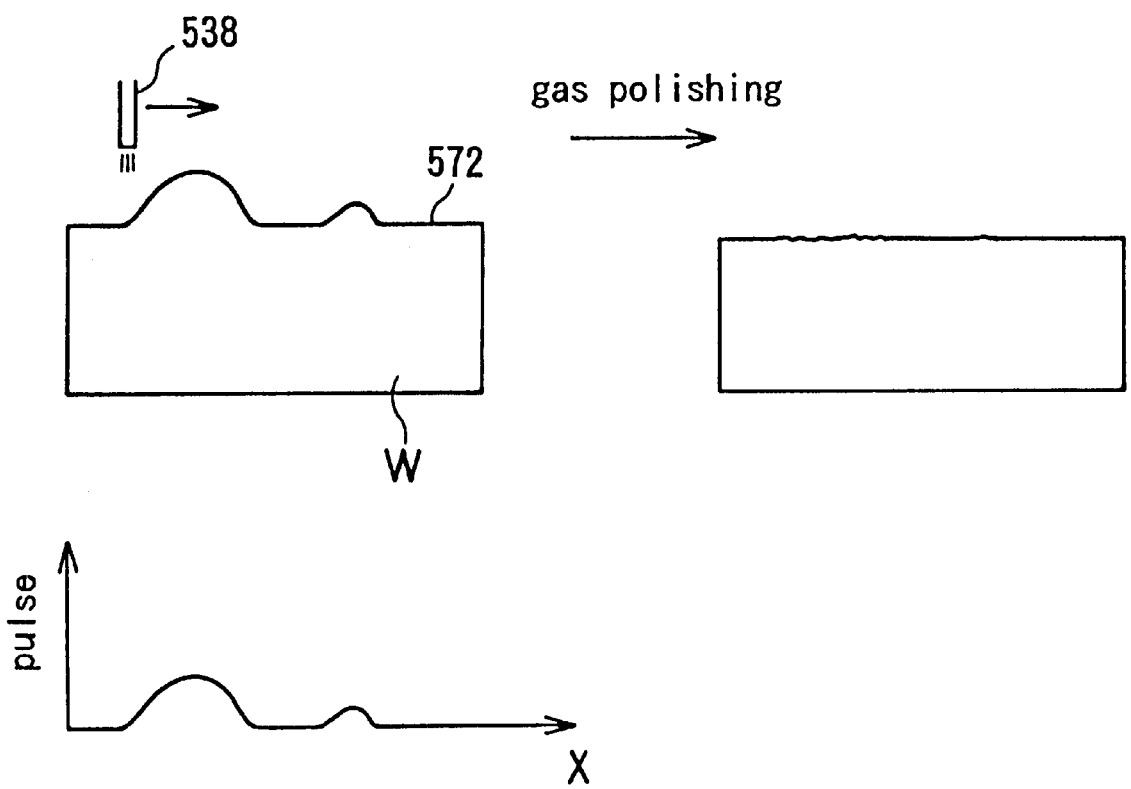

F I G. 38A
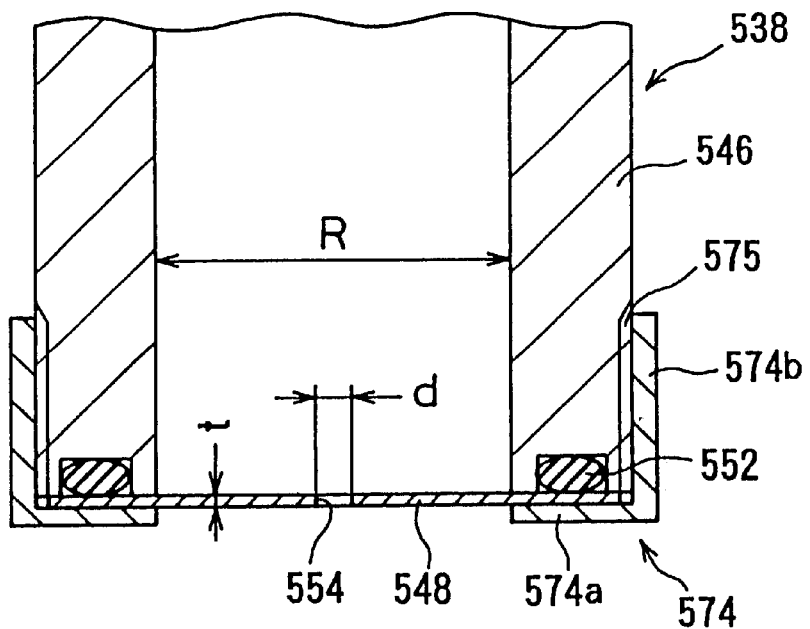
F I G. 38B
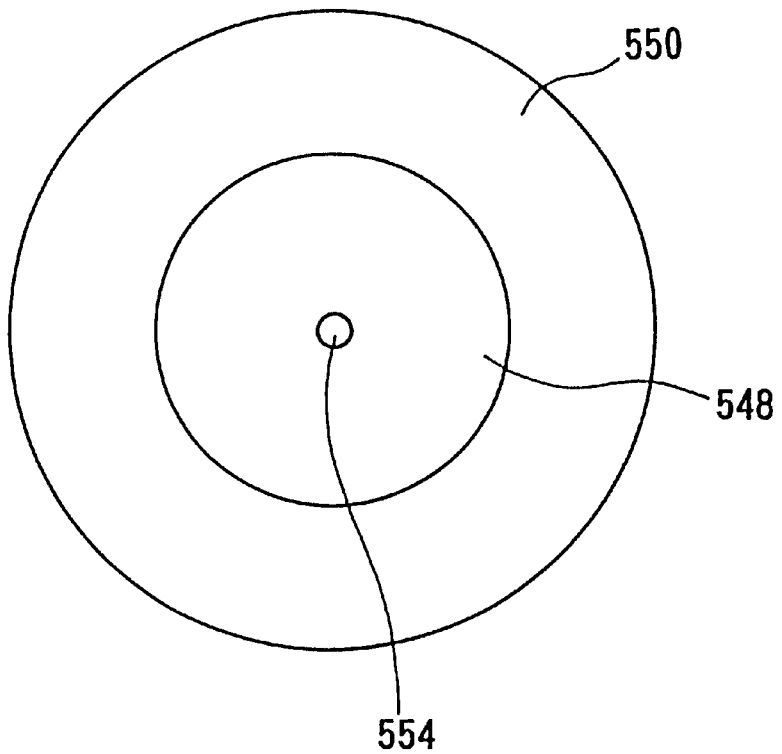

F I G. 4 3
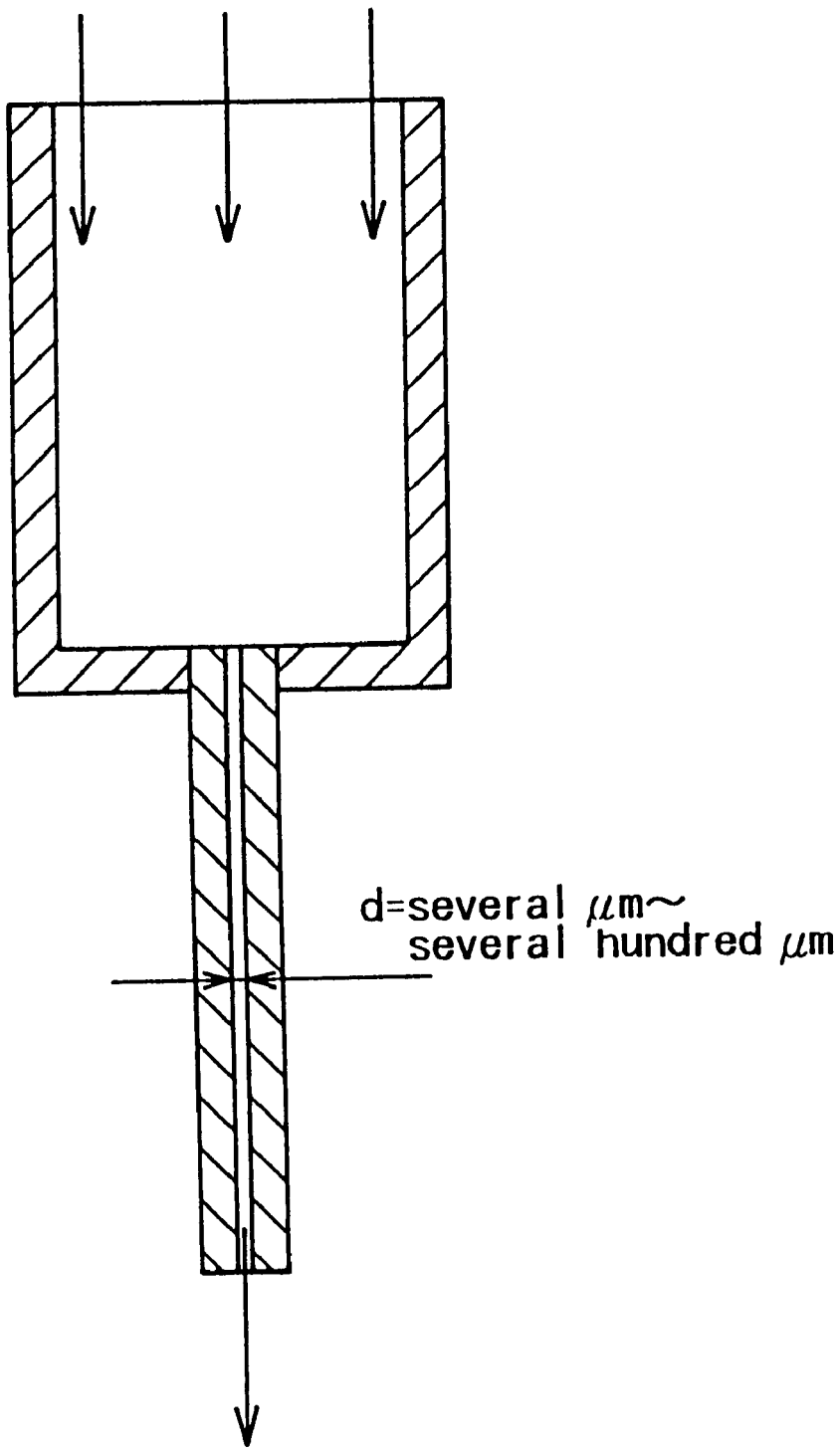
d=several μm~
several hundred μm

APPARATUS AND NOZZLE DEVICE FOR GASEOUS POLISHING

BACKGROUND OF THE INVENTION

1. Field of the Invention

The present invention relates a gas nozzle device used in a gaseous polishing apparatus to produce a flat surface by removing surface irregularities on an object such as a semiconductor wafer using a reactive polishing gas to polish/etch, or conversely, to fabricate surface structures on the surface by means of gaseous etching.

2. Description of the Related Art

A method of producing a flat surface on a substrate wafer is known as chemical mechanical polishing (CMP) in which a surface to be polished of a wafer which is held in a wafer holding device is pressed and rotated against an abrading surface of a polishing table while supplying a polishing solution, suitable for the material being polished, at the abrading interface.

However, the CMP process is designed to produce flatness by polishing the entire surface of a wafer, and therefore, it is not suitable for removing local surface irregularities, such as those shown in FIG. 1, and it often requires unnecessary removal of much surface material and suffers from low productivity.

For this reason, another known approach to obtaining a flat surface is to arrange a gas eject nozzle opposite to an object to be polished, such as semiconductor wafer, and eject a reactive gas onto the surface to remove macroscopic surface irregularities by gaseous etching.

A method of gaseous polishing shown in FIG. 2 is generally known, in which an object 101 to be polished is placed on a susceptor 102 in a polishing chamber 103. The chamber 103 is then evacuated through an exhaust port 104 to a reduced pressure, and a polishing gas is introduced into the polishing chamber 103, under reduced pressure, and the polishing gas is directed to a desired spot to be polished, from the nozzle opening of a polishing gas inlet tube (nozzle) 105 towards the object 101, for a given duration of time.

A typical chemical reaction which takes place for silicon is shown in equation (1) below. The polishing gas (F*, * indicating an active state of fluorine gas) ejected from the tip of the nozzle 105 impacts the surface of the object 101, a silicon wafer in this case, and forms a reaction product $SiF_4$ which vaporizes and removes surface material from the object 101.

$$Si+4F^* \rightarrow SiF_4\uparrow +C_2F_6 \qquad (1)$$

Excess polishing gas is exhausted from the polishing chamber 103, as indicated by arrows in FIG. 2, through the exhaust port 104.

As discussed above, although the unreacted polishing gas is removed form the polishing chamber 103 through the exhaust port 104, when the distance to the exhaust port 104 is long, etching can occur on locations other than a targeted location, resulting in removal of surface material from areas other than the desired location. This extraneous etching action causes serious problems in surface flatness. This effect may not be so serious when the material to be removed ranges in thickness from several micrometers to several tens of micrometers, but it can cause serious damage to the quality of a polished surface when it is necessary to perform precision polishing, in other words, removal of surface material of the order of several hundred angstroms to several thousands angstroms.

SUMMARY OF THE INVENTION

It is an object of the present invention to provide a gaseous polishing apparatus and a nozzle device designed for gaseous polishing so as to perform precision polishing only on a local target area on a surface of an object to be polished.

Such object is achieved in a nozzle device, to be disposed close to a local target area of a surface to be polished, for gaseous polishing of such surface of an object placed inside a polishing chamber. The nozzle device directs a polishing gas to the local target area from a nozzle opening provided at a downstream end of an eject nozzle of the nozzle device. A shutter device is disposed in proximity to the nozzle opening so as to control protecting or exposing the surface to the polishing gas. A control mechanism controls opening and closing operation of the shutter device.

Accordingly, a space between the shutter device and an open end of the nozzle is made small so as to decrease a lag in response between the opening/closing operations of the shutter device and start/stop actions of flowing the gas, thus to improve polishing precision. That is, only a desired amount of material is removed from a targeted area.

It is preferable that the shutter device and the control mechanism include a shield member freely movably supported in a vicinity of the nozzle opening of the eject nozzle. A moving device places the shield member either in a shielding position to block a gas stream ejected from the eject nozzle or in an exposing position to enable a local area of the surface to be exposed to the polishing gas.

It is preferable that the shutter device comprises valve means disposed in a vicinity of the nozzle opening in a gas flow passage within the eject nozzle for blocking or ejecting the polishing gas. A control device remotely controls opening and closing operations of the valve means.

It is also preferable that the shutter device and the control mechanism include a shield member disposed so as to shield areas other than the targeted location from the polishing gas ejected from the eject nozzle, and an attaching device for attaching the shield member to an outer periphery of the eject nozzle so as to be freely vertically movable.

Therefore, after finishing polishing of a local area, the shield plate is positioned in front of the nozzle opening before the nozzle is moved to a next target location. By so doing, unintended etching of areas other than the targeted area by the polishing gas can be prevented while the nozzle is being relocated. Also, by shutting the nozzle opening using the shutoff valve after a given amount of polishing has been completed, areas other than targeted areas are prevented from being etched, thereby enabling precision of the polishing operation.

It is preferable that gaseous polishing be followed by a chemical mechanical polishing process, so that gaseous polishing is used first to etch off relatively macroscopic surface irregularities, followed by the CMP process to polish fine surface irregularities, thereby providing precision polishing at high efficiency.

It is another object of the present invention to provide a polishing apparatus to replace or to be used in association with a conventional mechanical and chemical polishing apparatus to produce a high quality flat surface in a more efficient manner.

Gaseous polishing of a local area of a workpiece is achieved by ejecting a reactive polishing gas as pulsed ejections from a gas eject nozzle towards a target location at a high speed. A high speed in this context means that the velocity of the polishing gas ejected from the nozzle is in a range of sonic to ⅕ sonic speed, which has never been utilized in conventional gaseous polishing. The surface may be exposed to the polishing gas under a reduced pressure. The depth of etched profile may be controlled by adjusting the frequency of pulsed ejections.

A gaseous polishing apparatus for polishing a local area by exposure to pulsed ejections of the polishing gas ejected from the gas eject nozzle at a high speed comprises: the gas eject nozzle for ejecting the polishing gas, a gas supply device to supply the polishing gas to the gas eject nozzle, and a gas eject control device to produce high-speed pulsed ejections of the polishing gas.

The gas eject nozzle and the workpiece may be placed inside a vacuum chamber. The gas supply device may be provided with a gas reservoir for storing the polishing gas at a specific pressure in an upstream location of the gas eject nozzle. The gas reservoir is controlled by the gas eject control device so as to eject the polishing gas from the gas reservoir as pulsed ejections.

The gas eject control device may include a shutter device comprised by either a rotating disc or an electromagnetic valve, for controlling closing or opening of a gas opening of the gas eject nozzle, so that pulsed ejections are produced by controlling opening or closing of the shutter device. The gas eject control device may include a parameter selection device for controlling pulse duration and pulse frequency so as to adjust an amount of material to be polished.

A polishing facility may be comprised by combining the gaseous polishing apparatus described above with a CMP apparatus to provide additional chemical and/or mechanical polishing to a gas polished surface.

Another embodiment of the present invention is a nozzle device for ejecting a reactive polishing gas to a specific location on an oppositely disposed surface of a workpiece so as to polish surface structures on the surface, wherein a nozzle has a gas passage space provided at an upstream end and a gas hole or opening formed on a downstream side of the nozzle.

Accordingly, it is possible to minimize flow resistance through the nozzle, so that response to control can be improved to provide a polishing apparatus that is superior in controlling the etched profile.

The nozzle may include a tube member to extend towards the surface to be polished and a shutter disc member to close a downstream end of the tube member, the gas hole or opening being formed on the shutter disc member. Accordingly, a relatively simple structure can be used to lower flow resistance through a fine gas hole. Thickness t of the shutter disc member may be selected in a range of 10 to 1,000 μm. By so doing, flow resistance can be controlled using a practical material while maintaining a certain degree of strength.

A plurality of nozzles may be provided. Such a nozzle assembly can polish a larger area effectively. The nozzle may be comprised by a tube member to extend towards the surface and a header section disposed at a downstream end of the tube member. Such a design allows a larger area to be polished more uniformly.

BRIEF DESCRIPTION OF THE DRAWINGS

FIGS. 5A, 5B are, respectively, an enlarged cross sectional view of the end section of an open nozzle, and a bottom view of the nozzle in a first embodiment.

FIGS. 6A, 6B are, respectively, an enlarged cross sectional view of the end section of a closed nozzle, and a bottom view of the nozzle in the first embodiment.

FIGS. 14A, 14B are, respectively, an enlarged cross sectional view of an open nozzle, and a plan view through a line AA' in FIG. 14A.

FIGS. 15A, 15B are, respectively, an enlarged cross sectional view of a closed nozzle, and a plan view through a line AA' in FIG. 5A.

FIG. 16 is an enlarged cross sectional view of a dual tube nozzle device.

FIG. 26 is a table showing an example of polishing conditions.

FIG. 32 is a plan view of an example of a polishing facility of the present invention.

FIG. 36 is an illustration of changes in a surface profile during the gaseous polishing process.

FIGS. 38A, 38B are, respectively, a cross sectional view and a bottom view of the tip of another gas eject nozzle.

FIG. 43 is a cross sectional view of a comparison nozzle.

DETAILED DESCRIPTION OF THE PREFERRED EMBODIMENTS

Figure 1:
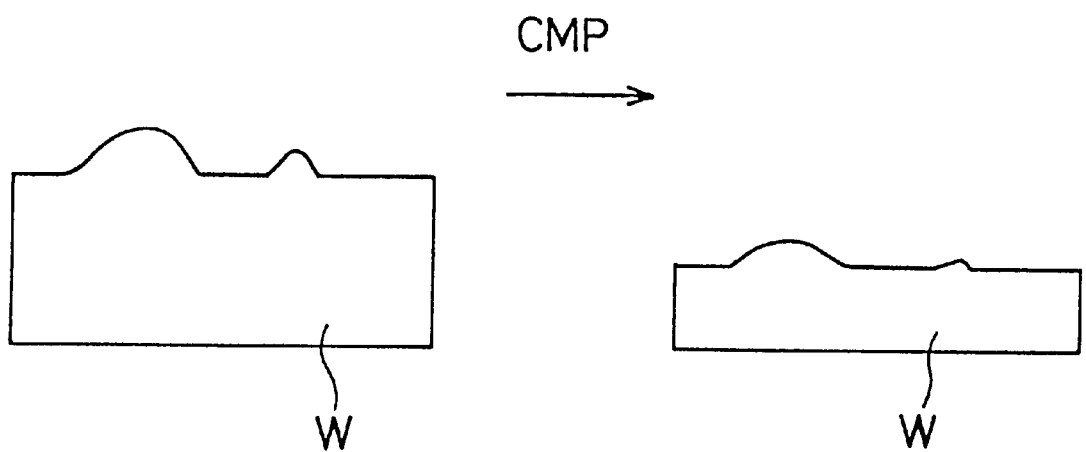
FIG. 1 is an illustration of a result of conventional chemical mechanical polishing.
Figure 2:
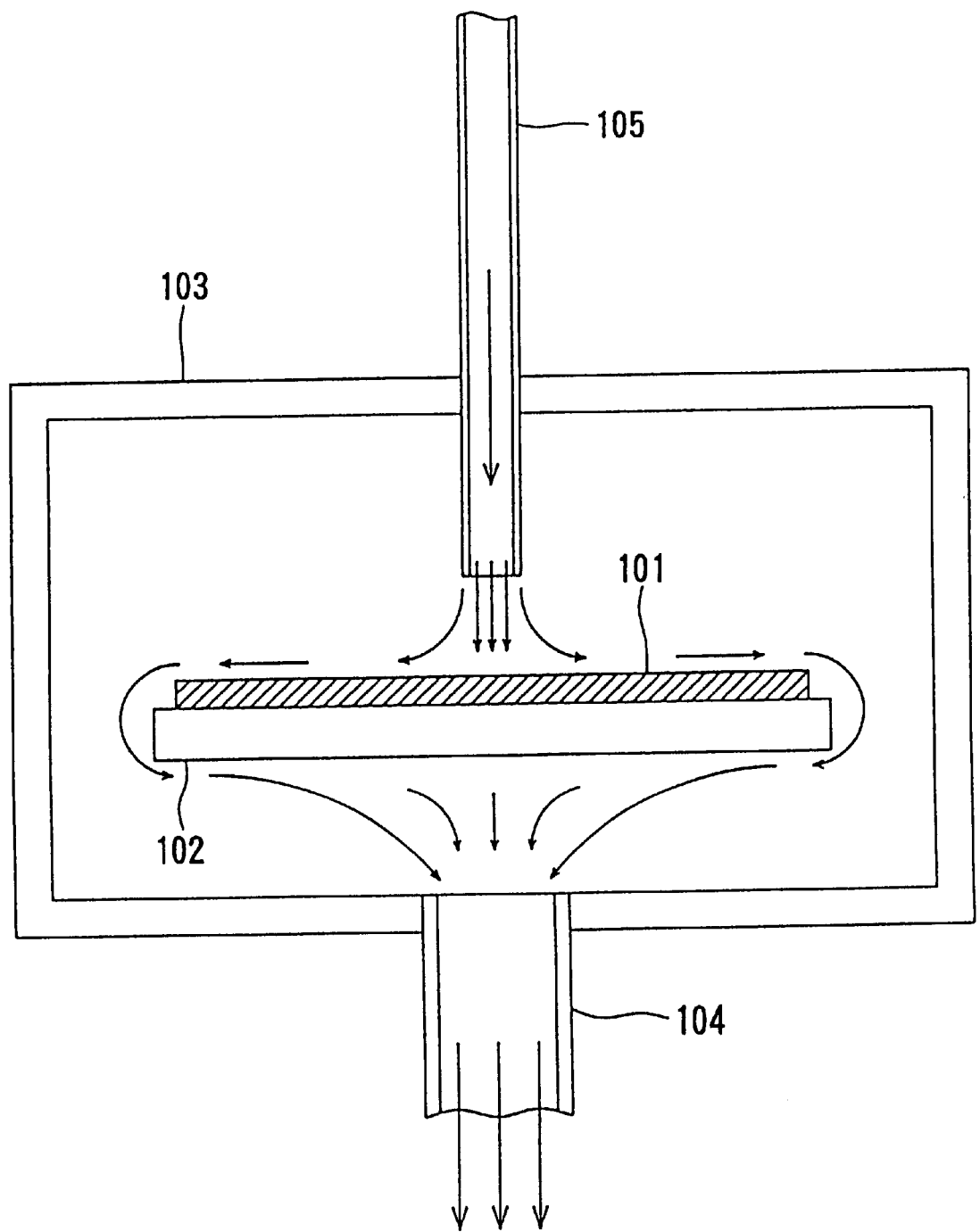
FIG. 2 is a cross sectional view of a conventional apparatus for gaseous polishing.
Figure 3:
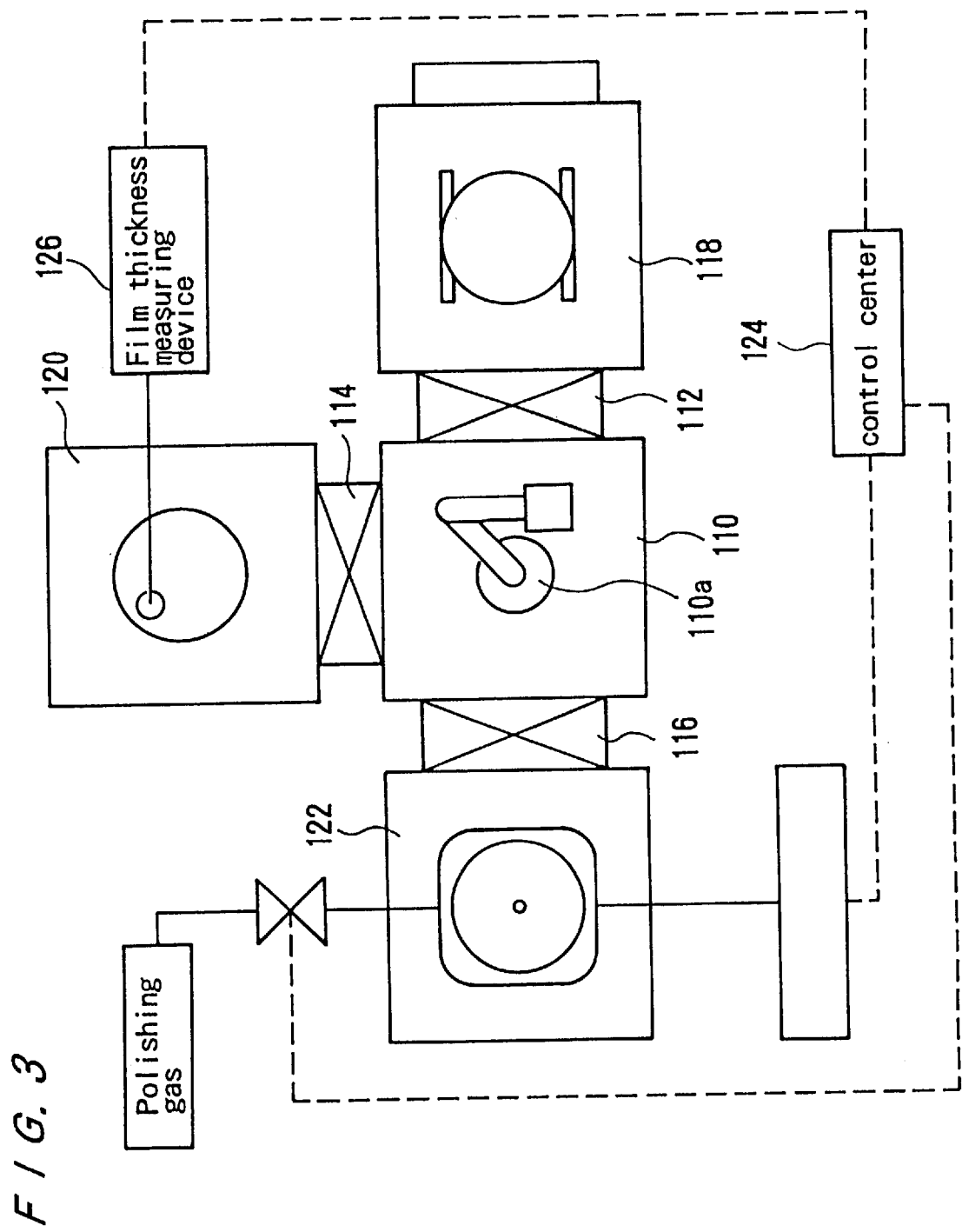
FIG. 3 is a plan view of a gaseous polishing facility applicable to a nozzle device of the present invention.

Preferred embodiments will be presented in the following with reference to the drawings. First, the overall arrangement of the gaseous polishing facility will be explained with reference to FIGS. 3 and 4. As shown in FIG. 3, the polishing facility is comprised by: four hermetic chambers (central robot chamber 110, substrate holding chamber 118 connected to the robot chamber 110 through respective gate valves 112, 114 and 116; film thickness measuring chamber 120; polishing chamber 122) and a control center 124 for controlling the individual components as well as the overall operation of the facility. Film thickness measuring chamber 120 is provided with a film thickness measuring device 126 including film thickness sensors such as an eddy current type film thickness sensor or an ellipsometer, which detects a distance to a workpiece therefrom. The polishing surface is scanned by the sensor to produce digitized data of fine surface structures or irregularities.

Figure 4:
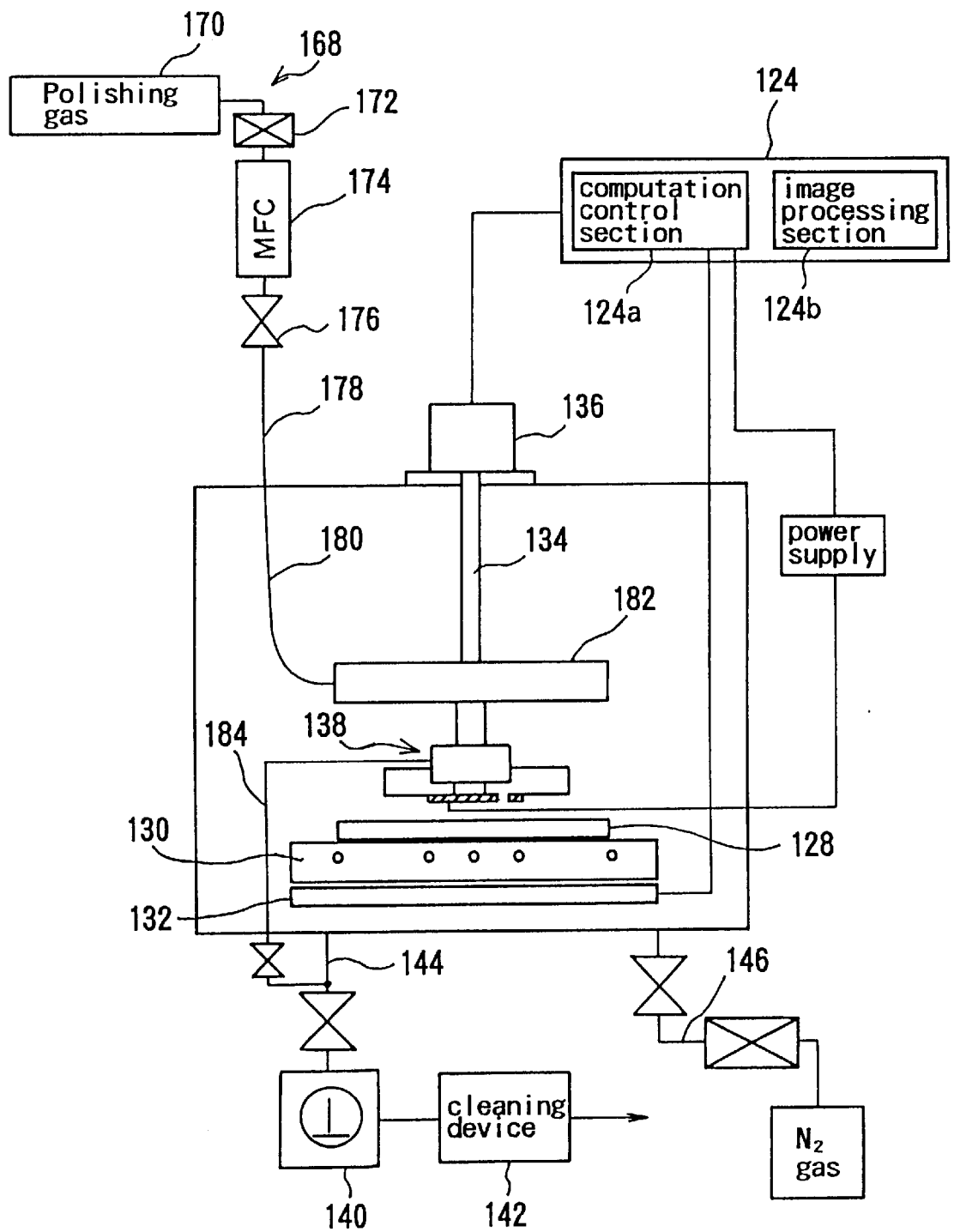
FIG. 4 is a schematic cross sectional view of the polishing chamber shown in FIG. 3 and associated devices.

As shown in FIG. 4, the polishing chamber 122 is provided with a central holding table 128 for placing a workpiece thereon, which includes a heater 130 for maintaining the workpiece at a predetermined temperature, and an x-y table 132 for moving the workpiece to a specific (or target) location within the chamber 122. A nozzle 138, supported by a support shaft 134 connected to an external elevator 136, is provided at a specific height or distance above the holding table 128. Polishing chamber 122 includes: a vacuum pump 140 for evacuating the chamber 122 to a given vacuum; an exhaust passage 144 to lead the exhaust gas to a cleaning device 142 for removing reaction components; a purge gas supply passage 146 for supplying a purge gas when necessary; a vacuum sensor for detecting the chamber vacuum; and a temperature sensor (not shown) to determine the workpiece temperature.

FIG. 5 shows nozzle device 138 according to a first embodiment and including a first tube section 148 and a second tube section 150 disposed at the downstream end of the first tube section 148. A nozzle opening 150a can be opened or closed freely by a gate section 154. Gate section 154 includes: a shutter plate 160 which reciprocates freely in the horizontal direction, by means of a spring member 158 attached to a support member 156. The support member 156 extends horizontally from the outer periphery of a third tube section 152 which is attached to the outer surface of the second tube section 150. Also the gate section 154 includes a solenoid coil 164 housing a portion of the shutter plate 160 which is comprised of magnetic material 162 so as to freely reciprocate therein. The shutter plate 160 has a nozzle hole 166 formed at a certain location.

As shown in FIG. 5, when the solenoid coil 164 is activated, the nozzle hole 166 is disposed directly below the opening 150a of the second tube section 150 of the nozzle device. However, as shown in FIG. 6, when the solenoid coil 164 is deactivated, the nozzle hole 166 is not disposed directly below the opening 150a of the second tube section 150, and then the nozzle device is blocked. These components are shown schematically, and other details such as the mechanisms for supporting the shutter, stoppers for regulating the movement of the shutter and seals on the opening section are omitted.

In this example, gas supply device 168 (refer to FIG. 4) is comprised by a gas source 170 containing a pre-mixed polishing gas made up of a reactive gas such as $CIF_3$ and an inert gas such as Argon; a filter 172, a mass flow control device (MFC) 174; a supply pipe 178 having a main electromagnetic valve 176, to deliver mixed gas into the polishing chamber 122, and ultimately to header 182 of the nozzle device 138 through a flexible tube 180. The MFC 174, a shutoff valve 176 and the solenoid coil 164 of the nozzle device are connected to a computation control section 124a of a control device 124, which also controls x-y table 132 and elevator 136, to deliver a given volume of polishing gas, depending on the requirements in various polishing locations on the workpiece.

In this embodiment, polishing gas is supplied not in a continuous stream but in pulses by opening the shutter coil 164 periodically. By so doing, the polishing gas supplied to the target location reacts in an instant with the polishing surface of the workpiece W, but is dispersed away immediately. Therefore, it is possible to achieve polishing of only the targeted location. Pulsed eject facilitates control of the amount of polishing gas supplied to the location, but it is permissible to supply the polishing gas continuously, if so desired. The space inside the third tube section 152 is communicated with exhaust gas passage 144 through pipe 184, and a large portion of the reacted polishing gas is exhausted through this passage, so that the effect of gaseous polishing can be localized to provide precision control.

Next, a process of planarization of the workpiece using the above described gaseous polishing apparatus will be explained. The workpiece is transported from the holding chamber 118 to the film thickness measuring chamber 120, which performs measurements of film thickness over the entire surface to be polished of the workpiece using the film thickness measuring device 126, and the measured distribution data of the film thickness is stored in an image processing section 124b in the process control device 124.

The computation control section 124a of the control device 124 determines the amount of gaseous polishing required in the various locations of the workpiece. For example, if it is desired to produce a flat surface on the workpiece, polishing parameters such as the rate of flow and concentration of the polishing gas flowing through the nozzle 138 and the duration of gaseous polishing (pulse count) are determined according to the height of undulations existing at the various locations on the mapped surface of the substrate wafer.

Next, the workpiece is transported by robot 110a into the polishing chamber 122 which is evacuated to a desired vacuum, and the substrate is heated to a suitable temperature using heater 130, and the height of the nozzle above the workpiece is adjusted according to the details of the structure to be polished and the above parameters.

The surface is scanned by moving the x-y table in such a way that the target location of the workpiece will be successively brought directly under the nozzle 138. Then, the polishing gas is ejected by operating the solenoid coil 164 according to the pre-determined parameters in the mapped film thickness table in the stored data for the surface. Polishing gas may be ejected continually while the workpiece and the nozzle 138 are being moved relative to the other, or the workpiece may be stopped momentarily below the nozzle 138.

In this process, the polishing gas passing through the shutoff valve 176 passes thorough supply pipe 178, flexible tube 180, and the second tube section 150 of the nozzle device 138, and is constricted by the nozzle hole 166 formed on the shutter plate 160, and is ejected to the target location of the workpiece to produce precision polishing of the target area on the workpiece surface. Because the shutter plate 160 for controlling the supply of polishing gas is provided at the downstream end of the nozzle device 138, there is little lag in responding to a control command.

Figure 7:
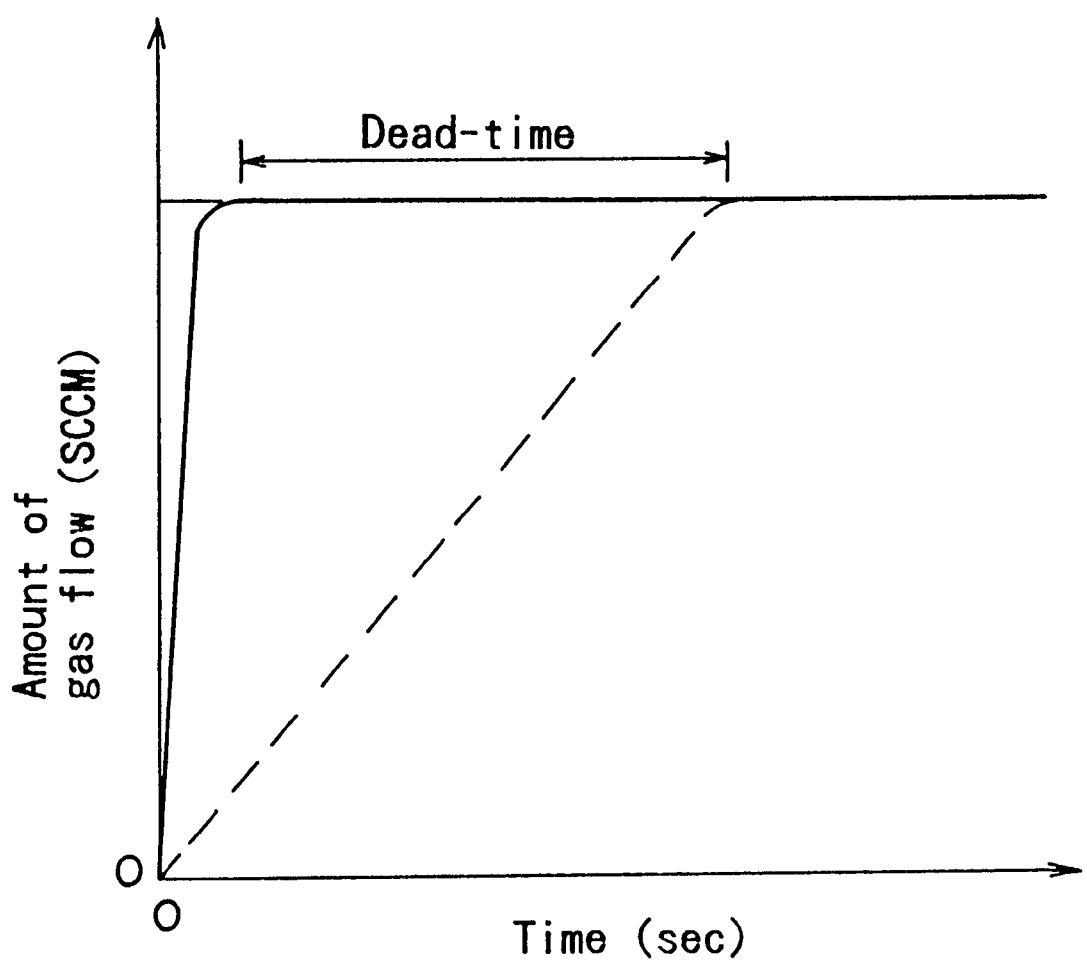
FIG. 7 is a graph to show the response characteristics of the chamber shown in FIG. 2 and a chamber having the present nozzle device.

The effect of lag time is demonstrated in FIG. 7. When gas flow control is carried out by shutoff valve 176 located externally to the polishing chamber, the polishing gas must travel through a long piping until it is ejected from the nozzle, causing a dead-time zone from the time of the opening of the valve 176 to the actual event of ejecting, as illustrated in FIG. 7 by a dotted line. Using the present nozzle device shown in FIGS. 5A–5B, there is little delay in the control action as indicated by the solid line in FIG. 7. This factor also contributes to precision polishing.

After performing cleaning and drying of a polished workpiece as necessary, the polished workpiece is returned by robot 110a to the film thickness measuring chamber 120 to re-measure the film thickness. When the surface flatness is outside the allowable range, polishing is repeated, but when the flatness is within the allowable range, it is placed in the holding chamber 118. It is permissible to transfer the gas polished workpiece to a CMP process to produce a completely polished surface by eliminating microscopic irregularities.

Although scanning of the workpiece surface was performed by moving the surface in this example, the workpiece may be left stationary while the gas eject nozzle 138 is moved in the x-y directions. The manner of moving the nozzle 138 with respect to the workpiece is not limited to x-y directions, such that any suitable combination of movement produced by rotation and linear translation is acceptable.

Figure 8:
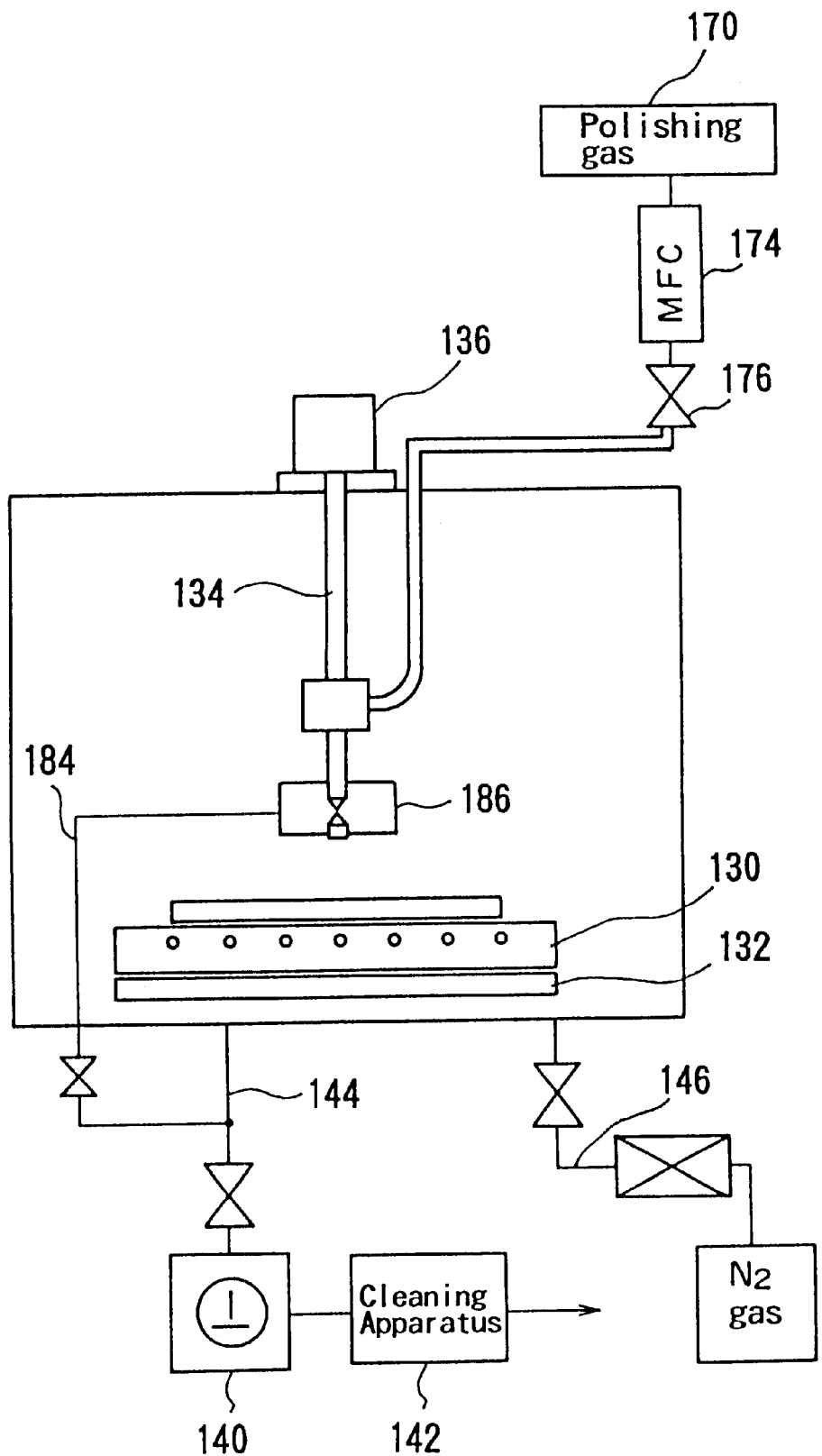
FIG. 8 is a cross sectional view of an arrangement of the gaseous polishing apparatus based on a nozzle device in a second embodiment.
Figure 9:
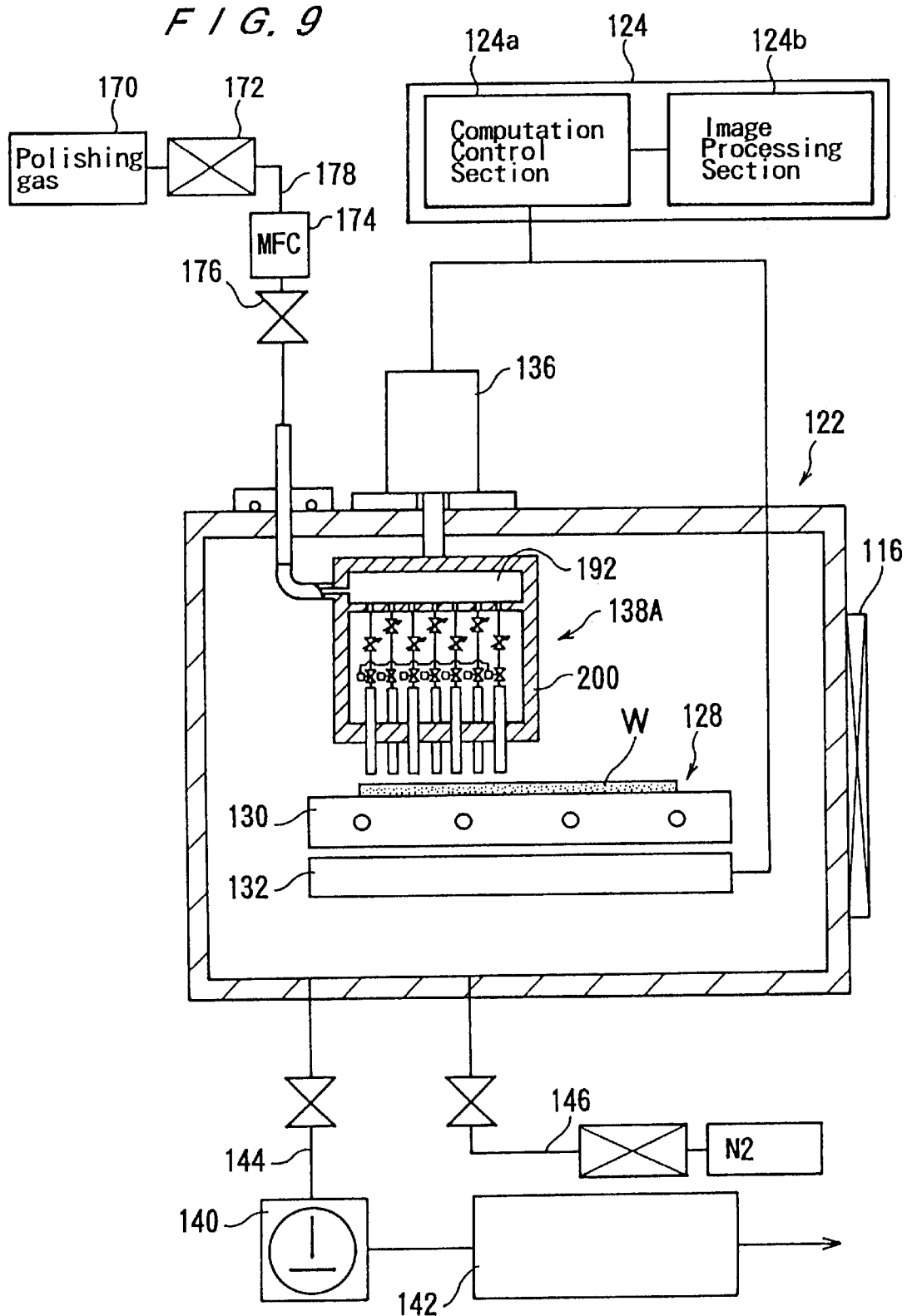
FIG. 9 is a cross sectional view of a variation of the nozzle device shown in FIG. 8.

FIG. 8 shows a second embodiment of the nozzle device of the present invention, in which a commercial electromagnetic valve 186 is provided at the downstream end of the nozzle. Similar to the previous embodiment, gas flow can be stopped near the downstream end of the nozzle device, thus resulting in preventing a delay in control action caused by leaking of the polishing gas remaining in the space between the valve 186 and the nozzle tip after the valve has been closed.

Figure 10:
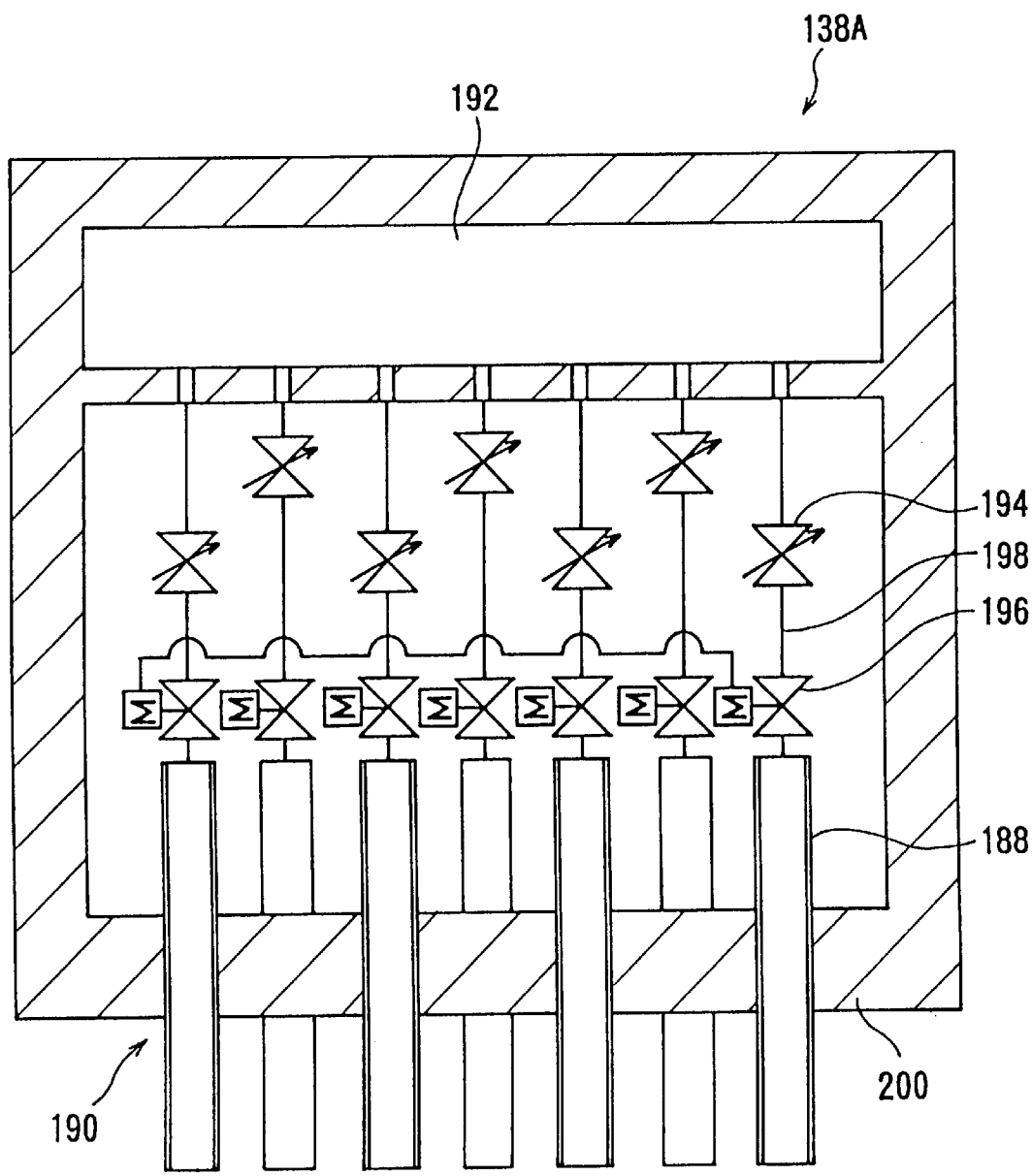
FIG. 10 is an enlarged cross sectional view of the nozzle device used in the polishing chamber shown in FIG. 9.

FIGS. 9 to 12 show variations of the nozzle design presented above. The nozzle device 138A has a nozzle assembly 190 made of a plurality of nozzles 188. As shown in FIG. 10, the nozzle assembly 190 is comprised by a header 192 for storing a polishing gas at a given pressure and a plurality of gas supply pipes 198 communicating each nozzle 188 with the header 192 through a respective flow adjusting valve 194 and a shutoff valve 196. These valves are operated by a remote control device, such as an electromagnetic actuator, so that the flow rate can be individually adjusted by being connected to output terminals of the control device 124.

Figure 11:
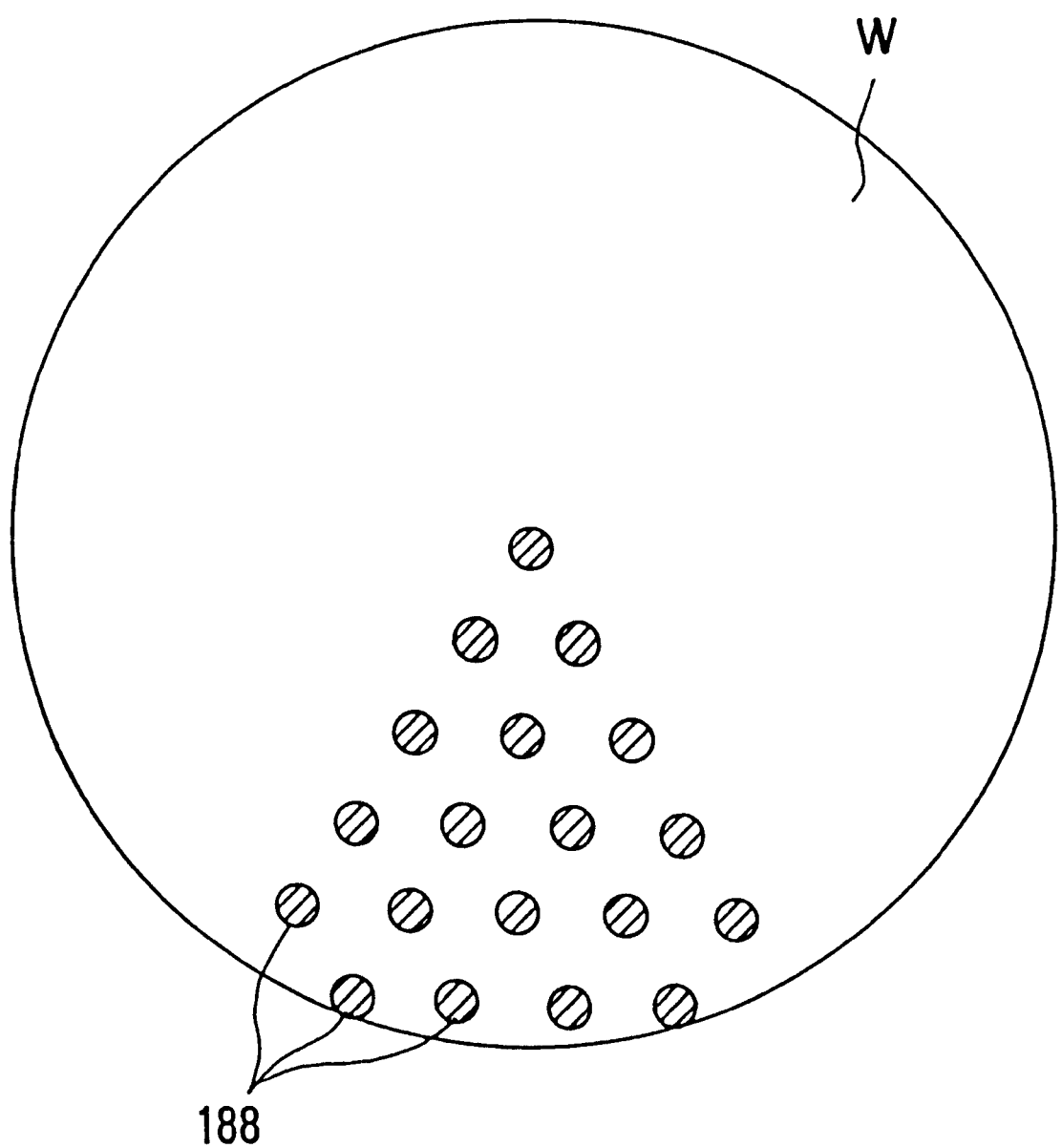
FIG. 11 is a plan view of an arrangement of nozzles in a nozzle assembly.
Figure 12:
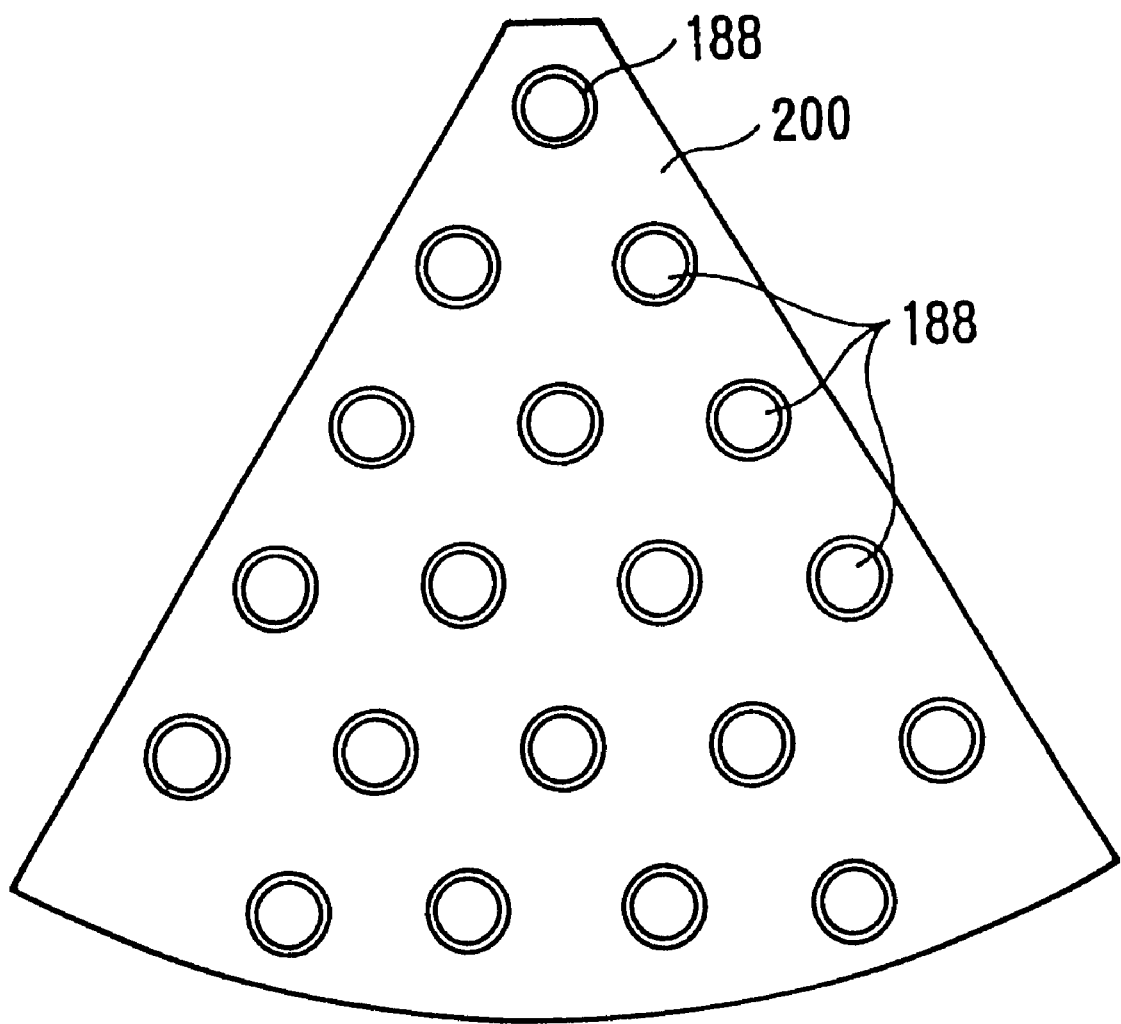
FIG. 12 is a plan view of another nozzle assembly.

The nozzle assembly 190 used in this embodiment has a fan-shaped nozzle disc 200 which occupies ⅙ of the surface area of the workpiece W, as shown in FIGS. 11–12, and has an apex angle of 60 degrees, and a plurality of nozzle pipes 188 of a specific diameter distributed at equal distances in a shape of a equilateral triangle. In this nozzle device, a first ⅙ area of the workpiece W is polished by flowing a polishing gas through the nozzles 188. Next, the workpiece W is rotated through a ⅙ sector, and this area is gaseous polished in a similar manner. By repeating this process for the remaining sectors, the entire polishing surface of the workpiece W is polished in succession.

The assembly design of the nozzle device is more efficient in processing a given workpiece W compared with a nozzle device having a single nozzle. The area of the nozzle assembly may be made the same as that of the workpiece W, so that the entire area of the workpiece W may be processed in one polishing operation, thereby raising productivity even further.

Figure 13:
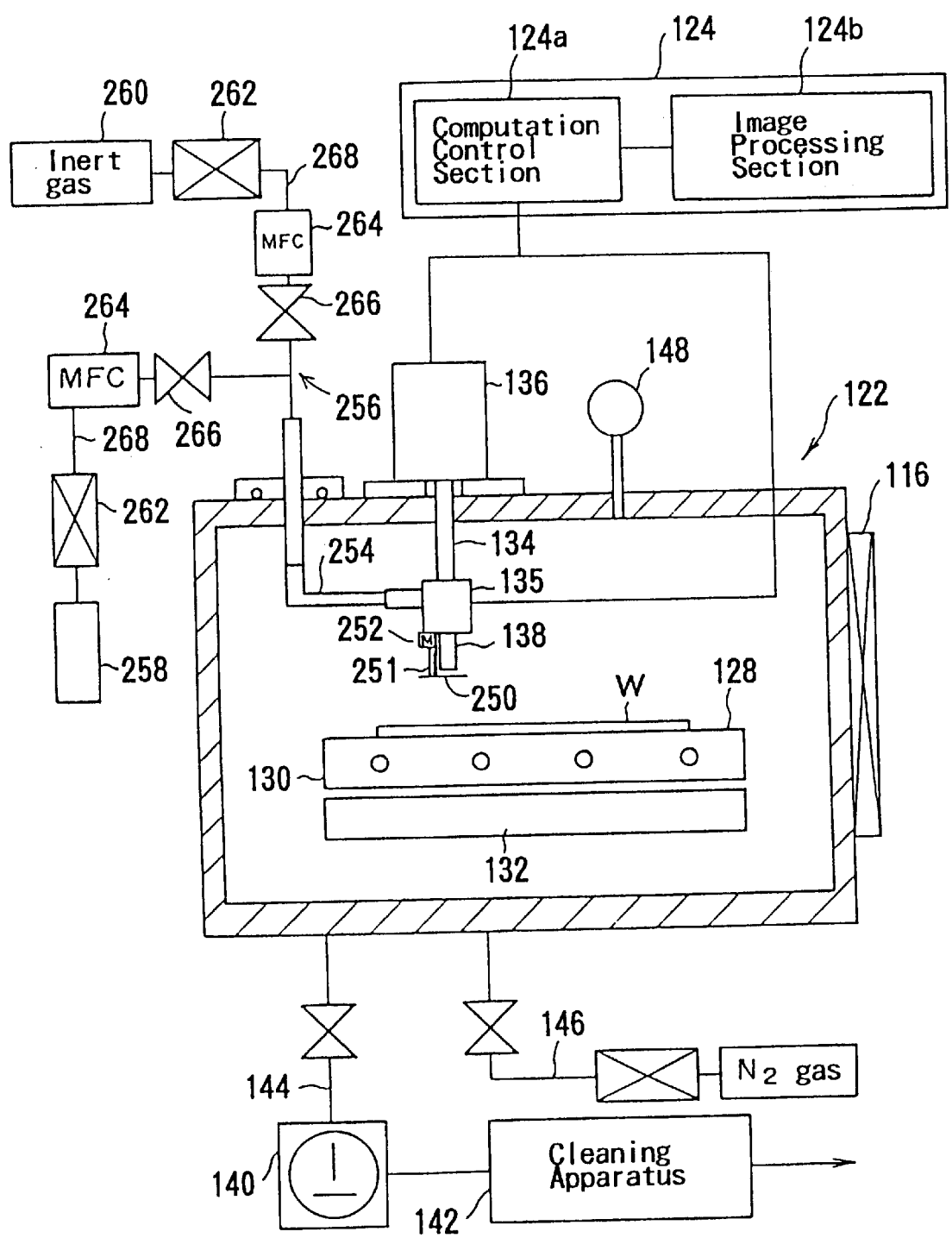
FIG. 13 is a schematic view of another arrangement of the gaseous polishing apparatus.

FIG. 13 shows an overall arrangement of the gaseous polishing apparatus having a third embodiment of the nozzle device. Polishing chamber 122 is connected to a robot chamber (not shown) through a gate valve 116, and the robot chamber is similarly connected to a holding chamber (not shown). Therefore, the workpiece W is transported by a robot between the various chambers.

The film thickness measuring chamber is provided with various sensors, such as a remote distance sensor to measure the distance between the nozzle and the surface to be polished, an eddy current thickness sensor or an ellipsometer for measuring the film thickness. Surface structures are determined by scanning the surface with the sensors, and storing the data of surface irregularities as numeral data in image processing section 124b in control section 124. The control section 124 is provided with a computation section 124a which is equivalent to a central processor unit (CPU) and controls such parameters as positioning of the workpiece W within the polishing chamber 122 and ejection of a reactive polishing gas, as well as management of transport of the workpiece by the robot.

The polishing chamber 122 is provided with a central holding table 128, on which is placed a workpiece W, which includes a heater 130 for maintaining the workpiece W at a constant temperature, and an x-y table 132 for moving the workpiece W to a specific location within the chamber 122. A nozzle 138, supported on a support shaft 134 of an external elevator 136, is provided at a specific height above the holding table 128. Polishing chamber 122 includes: a vacuum pump 140 for evacuating the chamber 122 to a given vacuum; an exhaust passage 144 to lead the exhaust gas to a cleaning device 142 for removing reactive components; a purge gas supply passage 146 for supplying a purge gas when necessary; a vacuum sensor for detecting the chamber vacuum; and a temperature sensor (not shown) to determine the workpiece temperature.

As shown in FIGS. 14A–14B, a nozzle holder 135 includes nozzle 138 and a shield plate 250 for shutting off the ejection of the polishing gas, which is attached to a support shaft 251 with a drive device 252. Shield plate 250 is rotated about the support shaft 251 by the drive device 252 so as to block the nozzle opening of the nozzle 138. Therefore, when the shield plate 250 is positioned below the nozzle opening, the reactive polishing gas does not reach the surface of the workpiece W. In contrast, when the shield plate 250 is away from the opening of the nozzle, the polishing gas is directed to the surface to perform gaseous polishing.

FIGS. 14A–15B show the manner of opening and closing the nozzle of this nozzle device. FIGS. 14A–14B show the nozzle opening not blocked by the shield plate, and FIGS. 15A–15B show the nozzle opening being blocked by the shield plate.

The shield plate 250 is fixed to the support shaft 251 which is supported by a shaft 251 a fixed to the nozzle holder 135 so as to be freely rotatable about the shaft 251a. The support shaft 251 is rotated by the action of motor 252a and gear 252b so that the shield plate 250 can be positioned in the shielding or exposing position. Accordingly, when it is desired to perform gaseous polishing, the shield plate 250 is moved to the exposed position, as shown in FIGS. 14A–14B, and when it is desired to end the polishing operation, the shield plate 250 is rotated into the shielding position directly below the nozzle opening as shown in FIGS. 15A–15B. When the nozzle is being relocated or the workpiece W is being moved, the shield plate 250 is placed in the shielding position, as shown in FIGS. 15A–15B, so that the nozzle opening is blocked by the shield plate 250.

The nozzle 138 is connected to a flexible gas supply tube 254 to supply polishing gas. The supply tube 254 is connected to a gas supply device 256 which supplies, in this example, a pre-mixed polishing gas made up of reactive gas 258 such as $ClF_3$ and inert gas 260 such as Argon. The respective gas supply sources 258,260 are provided with individual supply pipes 268 each having a dedicated filter 262, a mass flow control device (MFC) 264, an electromagnetic valve 266, and are connected to supply pipe 254 to deliver the mixed gas into the polishing chamber 122. The MFCs 264 and shutoff valves 266 are connected to output terminals of the control device 124 (not shown) to control the flow of polishing gas and the operational timing of the shield device (refer to FIG. 13).

In this embodiment, polishing gas is supplied not in a continuous stream but in pulses by controlling the valves 266. By so doing, the polishing gas ejected against the target location reacts in an instant with the surface of the workpiece W but is dispersed immediately to provide polishing of only the targeted location. Pulsed ejection facilitates control of the amount of polishing gas supplied to the location, but it is permissible to supply the polishing gas continuously if so desired.

Next, the process of gaseous polishing of the workpiece W using the above described gaseous polishing apparatus will be explained. The workpiece W is transported from the holding chamber (not shown) to the film thickness measuring chamber, which performs measurements of film thickness over the entire polishing surface of the workpiece W using the film thickness measuring device, and the measured distribution data of the film thickness is stored in image processing section 124b in the process control device 124.

The computation section 124a of the control device 124 determines the amount of polishing required in the various locations of the workpiece. For example, if it is desired to produce a flat surface on the workpiece W, polishing parameters such as the rate of flow and concentration of the polishing gas flowing through the nozzle 138 and the duration of polishing (pulse count) are determined according to the heights of undulations existing at the various locations on the mapped workpiece surface.

Next, gaseous polishing is performed by evacuating the polishing chamber 122 to a desired degree of vacuum, after warming the substrate to a suitable temperature using the heater 130 and flowing the polishing gas through the nozzle 138 to perform polishing according to the parameters described above. The height of the nozzle 138 above the workpiece W is pre-adjusted according to the details of the structure to be polished and the distance between the nozzles using the elevator 136. When all the conditions are readied, the polishing gas is ejected by operating the shutoff valves 266 to open or close and subjecting a target location of the workpiece W to gas pulses at a given flow rate for a given duration.

When a gaseous polishing step is completed, the shield plate 250 is quickly rotated to the shielding position for the nozzle opening of the nozzle 138. As a result, the reactive gas remaining in the piping and the space between the opening of the nozzle 138 and the shutoff valves 266 is prevented from reaching the surface of the workpiece. Also, this procedure prevents extraneous polishing of areas other than the targeted location while the nozzle or the workpiece W is being relocated to another location to perform the next planned polishing.

The material of the shield plate may be any material that is resistant to the reactive polishing gas being used, such as stainless steels, nickel based metallic materials, or ceramic materials such as $Al_2O_3$, SiC. In this embodiment, stainless steels are used.

Also in this embodiment, motor 252a and gear 252b are used to open or close the shield plate 250 in synchronization with a polish-start or -end signal output from the control device 124. However, the drive device 252 can be comprised by a pneumatic cylinder using nitrogen gas or air.

After performing cleaning and drying of the polished workpiece as necessary, the polished workpiece is returned by the robot to the film thickness measuring chamber to re-measure the film thickness. When the surface flatness is outside the allowable range, polishing is repeated, but when the flatness is within the allowable range, it is placed in the holding chamber. It is permissible to transfer the gas polished workpiece to a CMP process to produce a microscopically polished surface.

FIG. 16 shows a variation of a nozzle which is provided with a shield plate. The nozzle 139 is a dual tube nozzle having a dual tube structure including an inner nozzle tube 139a and an outer exhaust tube 139b. Polishing gas is ejected from the inner nozzle tube 139a and the ejected gas is removed through the outer tube 139b. The polishing gas ejected towards the workpiece W is withdrawn after polishing the workpiece W. Therefore, coupled with the blocking effect provided by the shield plate 250, extraneous etching can be prevented even more effectively to protect the workpiece surface from being polished further after the planned polishing has been completed.

Figure 17:
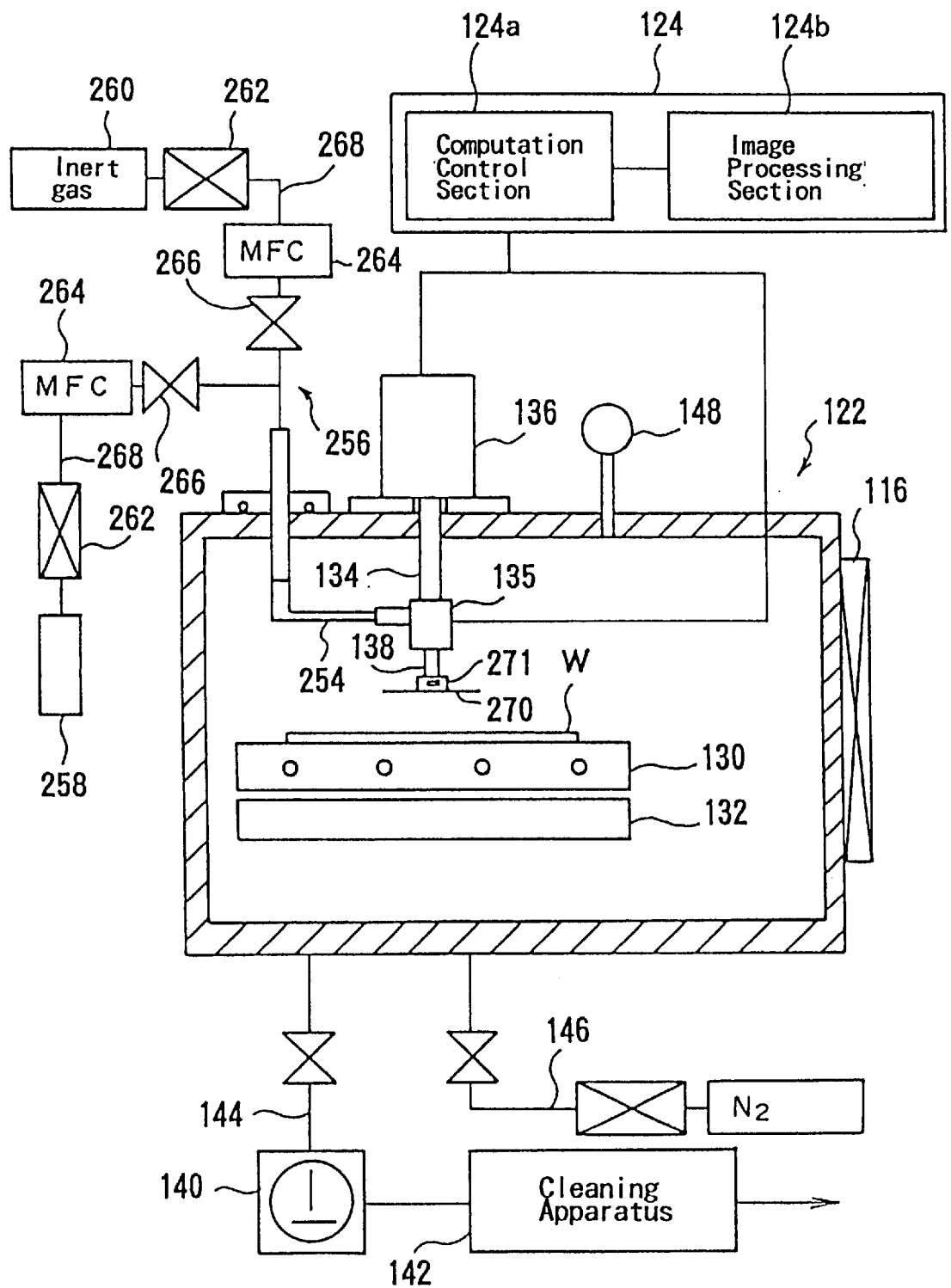
FIG. 17 is a cross sectional view of an arrangement of the gaseous polishing apparatus based on a third embodiment of the nozzle device.

FIG. 17 shows an overall arrangement of the gaseous polishing apparatus using a fourth embodiment of the eject nozzle. The overall construction is the same as that for the third embodiment shown in FIG. 13, except for a difference in the structure of the shield plate and its operation. The nozzle 138 is disposed opposite to a workpiece W, and a polishing gas is directed to the polishing surface as before, but the shield plate 270 is attached to the outer periphery of the nozzle by an attachment device 271 in such a way to shield the areas other than the targeted location of the workpiece surface.

Figure 22A:
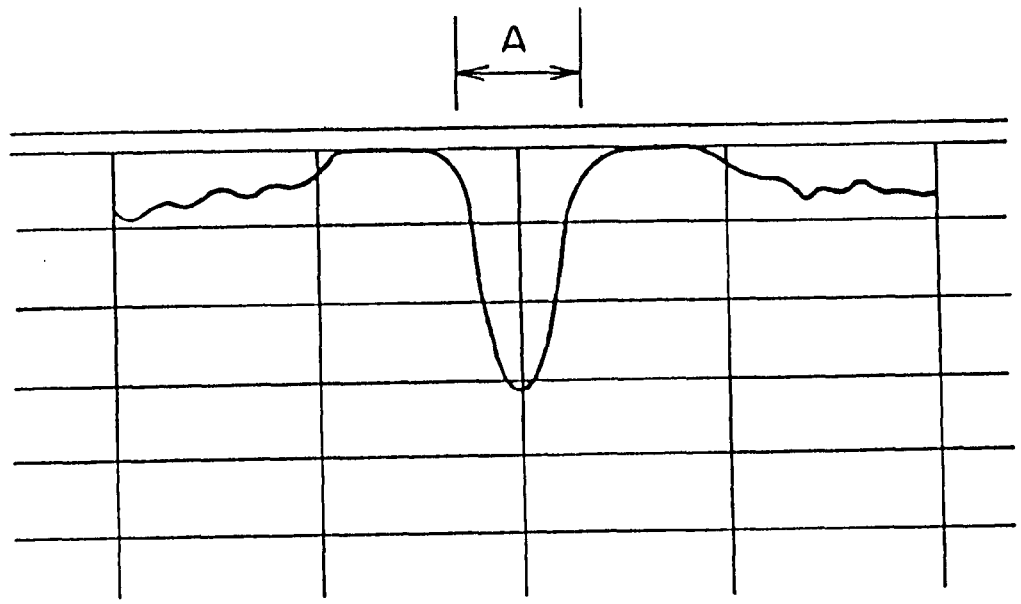
FIGS. 22A, 22B are, respectively, surface profiles produced without a shield plate and with a shield plate.
Figure 22B:
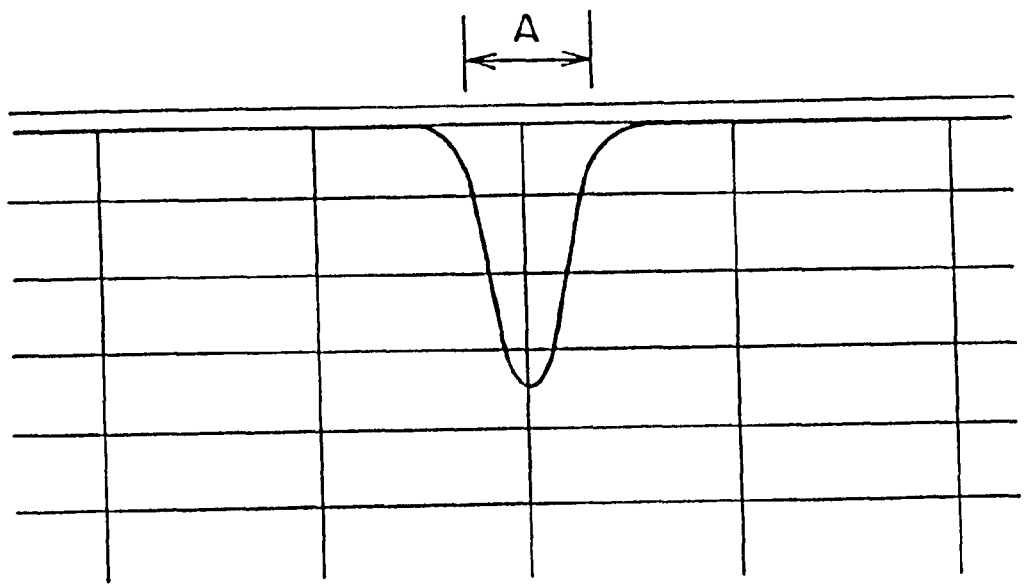

In general, gaseous polishing presents a problem that, when a gas stream from the nozzle 138 is directed to a targeted location, the gas stream impacts the polishing surface and is dispersed instantly. Because of this effect, areas other than the targeted area are polished by the dispersed gas. This effect is shown in FIG. 22A which shows a polished profile produced by uncontrolled gaseous polishing of areas surrounding the targeted location as well as a deep valley formed at the targeted polishing area A, while FIG. 22B shows a polished profile produced under controlled etching of only the targeted area A using the present design of the nozzle device.

For this reason, the shield plate 270 shown in FIG. 17 is designed to prevent extraneous etching of non-targeted areas, caused by a creeping action of the dispersed polishing gas, by forcing the shield plate 270 to be in close contact with and to shield non-targeted areas of the workpiece W.

Figure 18A:
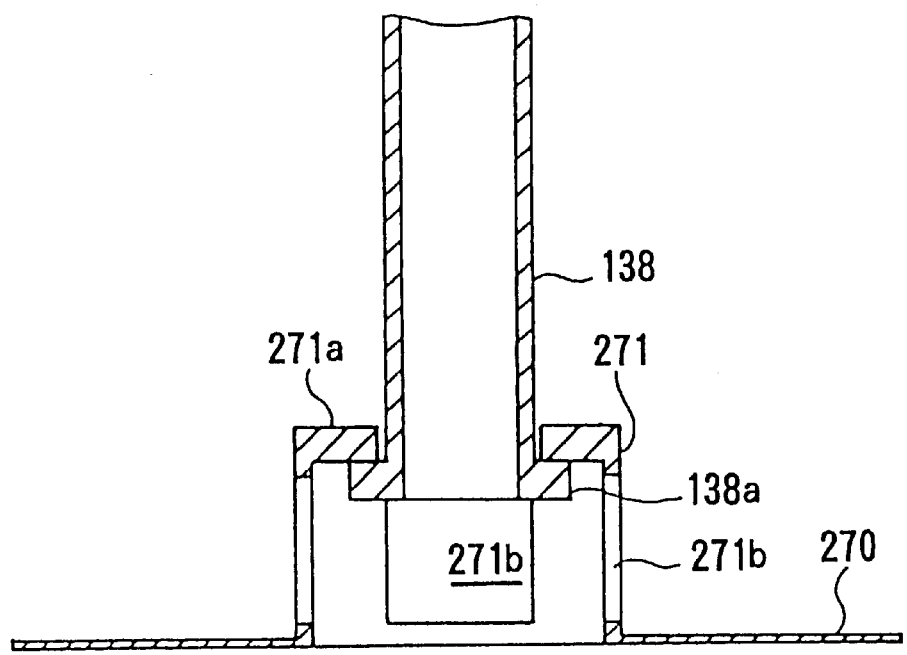
FIGS. 18A, 18B are, respectively, an enlarged cross sectional view of the open section and a bottom view of the nozzle device.
Figure 18B:
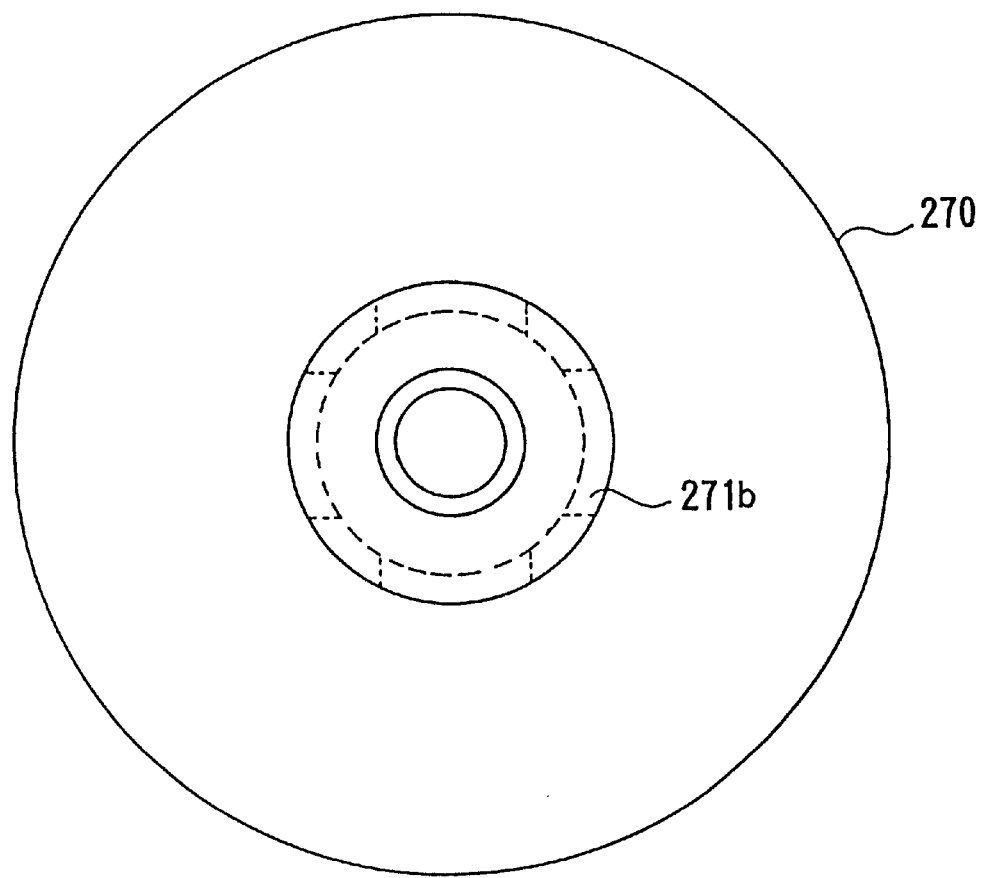

FIGS. 18A–18B show the structural details for attaching the shield plate to the outer periphery of the nozzle. In this embodiment, the shield plate 270 is disc-shaped having a center hole for fixing attachment member 271 to its inside periphery. The attachment member 271 is comprised by a disc-shaped flange 271a having a center hole, and the flange 271a slides along the outer periphery of the nozzle 138 to enable the flange 271a to move vertically along the outer periphery of the nozzle 138. The downstream end of the nozzle 138 has a flange 138a so that, when the nozzle 138 is moved upwards, the flange 271a of the attachment member 271 engages with the flange 138a on the nozzle-side, thereby raising both the shield disc 270 and the nozzle 138. Windows 271b are provided on a side wall of the attachment member 271 so as to eliminate the polishing gas being deflected from the workpiece W to the outside.

Materials suitable for making the shield pate include stainless steels, nickel based metallic materials, or ceramic materials such as $Al_2O_3$. The dimensions of the shield plate depend on the size of the workpiece, but a suitable size is 10~200 mm outer size, and the inner diameter of the shield plate is selected according to the diameters of the nozzle as well as the size of the workpiece to be polished.

Figure 19A:
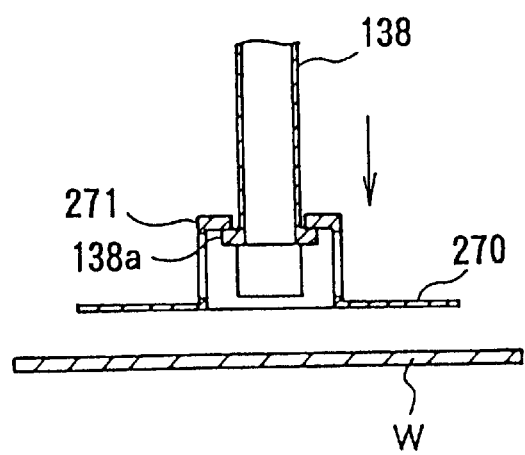
FIGS. 19A~19E are cross sectional views of the nozzle device in various stages of operation.
Figure 19B:
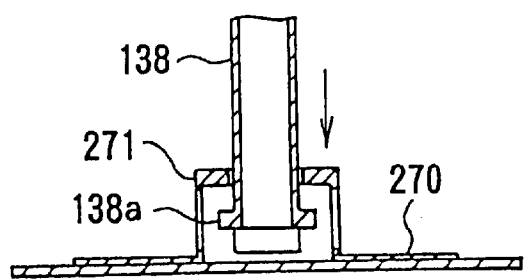

A method of using the shield plate will be explained with reference to FIGS. 19A~19E. First, as shown in FIG. 19A, the nozzle 138 is aligned with the target location on the workpiece surface, and the nozzle 138 is lowered by means of the elevator. In this case, the shield plate 270 is engaged with the flange 138a so that both members descend together. Upon further lowering, the shield plate 270 comes into contact with the workpiece in such a way to shield areas other than the target area, as shown in FIG. 19B.

Figure 19C:
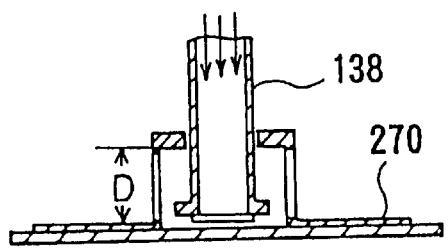

After this stage, only the nozzle 138 descends until the distance between the nozzle end and the workpiece surface reaches a pre-determined value, at which point the nozzle stops moving downward. At this point, the polishing gas is ejected from the nozzle 138 towards the surface as illustrated in FIG. 19C. Ejection of gas is continued for a given duration, while the ejected gas is removed through the window section 271b of the attachment member 271.

The distance D shown in FIG. 19C indicates the allowable distance that the nozzle 138 can move while continuing to shield the area other than the targeted area. The value of the dimension D can vary depending on the nozzle diameter, and can be chosen to be any suitable value, but if it is too large, the vertical distance must be correspondingly increased. For example, for a 6 mm diameter nozzle, 30 mm is a suitable value for D.

Figure 19D:
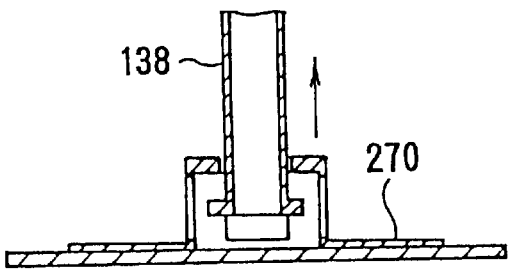
Figure 19E:
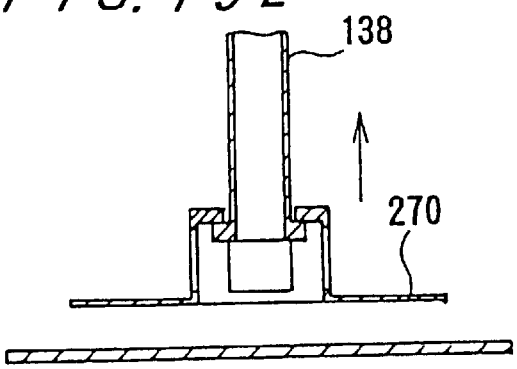

When the gaseous polishing step is completed, nozzle 138 is raised as illustrated in FIG. 19D. Only the nozzle 138 is raised until the nozzle flange 138a comes into contact with the attachment flange 271b of the member 271. As illustrated in FIG. 19E, when the nozzle flange 138a touches the attachment flange 271b, the shield plate 270 rises with the nozzle 138, and the nozzle is moved to a next polishing location.

Figure 20:
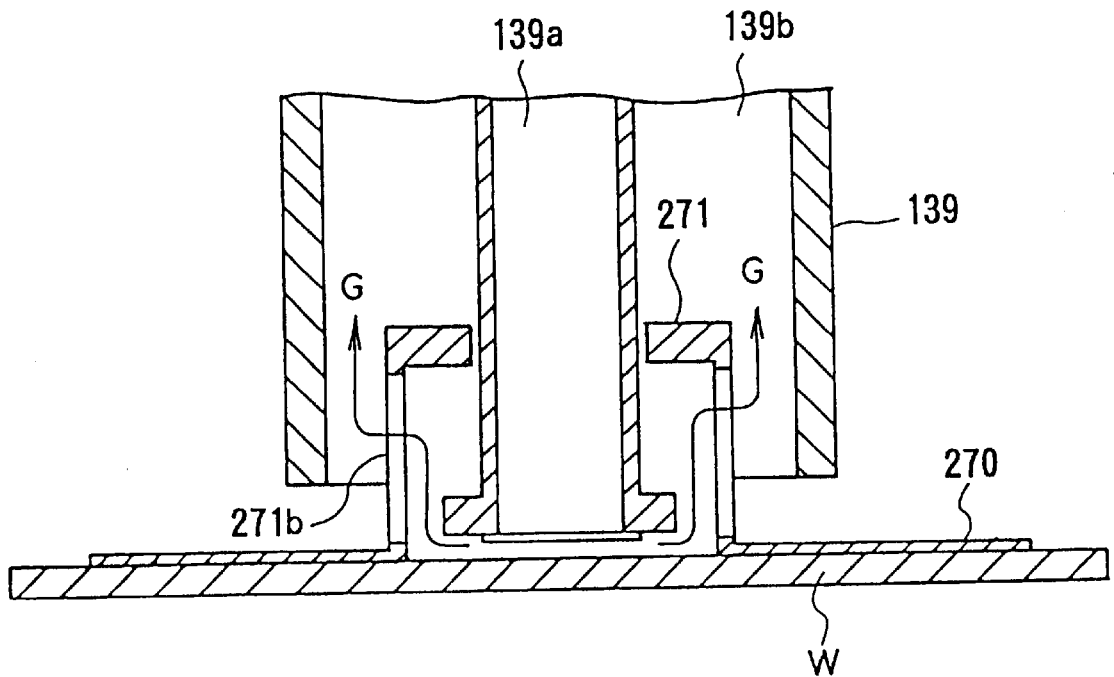
FIG. 20 is an enlarged cross sectional view of a dual tube nozzle device.

FIG. 20 shows a variation of the nozzle device presented above. This nozzle device is comprised by a concentric dual tube structure (coaxial structure) having an inner tube 139a and an outer tube 139b, so the gas is ejected through the inner tube 139a and removed through the outer tube 139b. The nozzle hole in the attachment flange is designed to fit the inner nozzle 139a, and the window section 271b of the attachment section 271 is designed to fit within the outer tube 139b.

Therefore, the ejected gas during the polishing process is removed through the window section 271b to the space within the outer tube 139b. Accordingly, the volume of the gas escaping from the nozzle 139 is reduced, and together with the effects created by the shield plate 270, even better results are obtained to prevent extraneous polishing of areas other than the targeted area.

Figure 21:
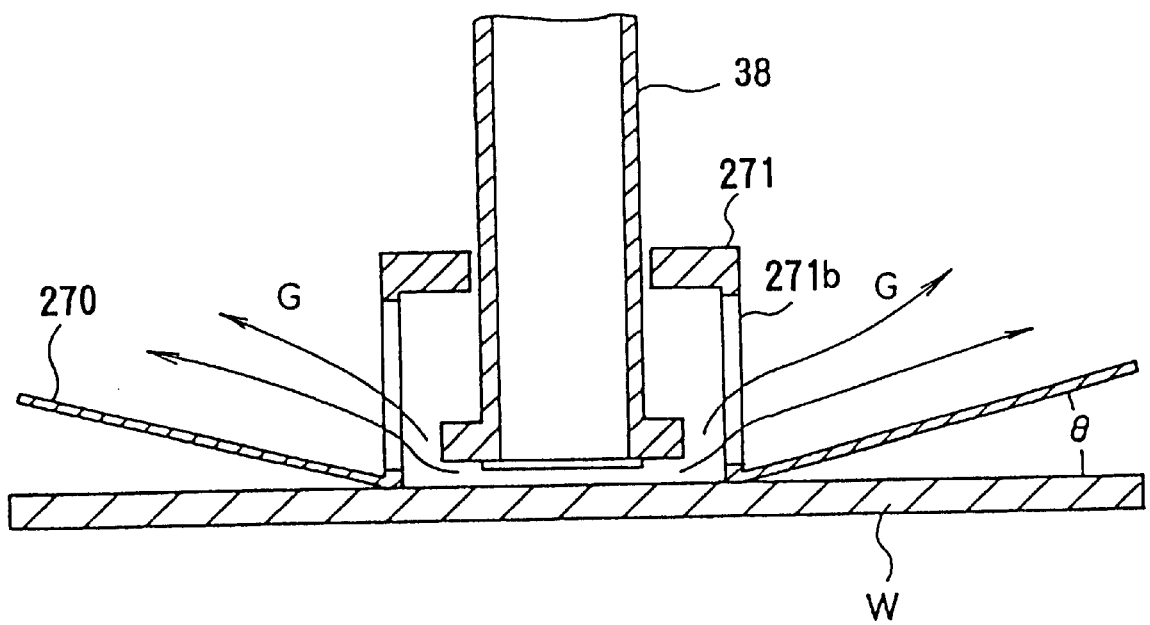
FIG. 21 is an enlarged cross sectional view of a flow guiding shield plate.

FIG. 21 shows still another variation of the shield type nozzle device. In this example, the shield plate 270 is attached at an angle θ to the workpiece plane. A suitable range of the angle θ is 0~60 degrees. According to such a design of the shield plate, the gas G removed through the window section 271b is guided upwards along the shield plate. This design makes it possible to achieve an even more improved effect of preventing non-targeted areas from being exposed to gas. Therefore, by combining the dual tube nozzle construction with the gas guiding shield plate, it is possible to attain a maximum benefit of prevention of extraneous polishing.

FIG. 22A shows a polished profile produced by not using a shield plate which produces uncontrolled etching of areas surrounding the targeted area A, resulting in producing surface irregularities around the target A. FIG. 22B shows a polished profile produced by using a shield plate to shield the areas other than the targeted area A, which produces controlled gaseous polishing (etching) of only the targeted area A and very little etching in the surrounding areas.

Workpieces which can be processed in this type of gaseous polishing include materials such as silicon wafers, polycrystalline silicon thin films, Cu thin films and Al thin films. Polishing gases are chosen according to the nature of the workpiece W. For example, $ClF_3$, $CF_4$, $Cl_4$ are suitable for polishing silicon wafers.

Figure 23:
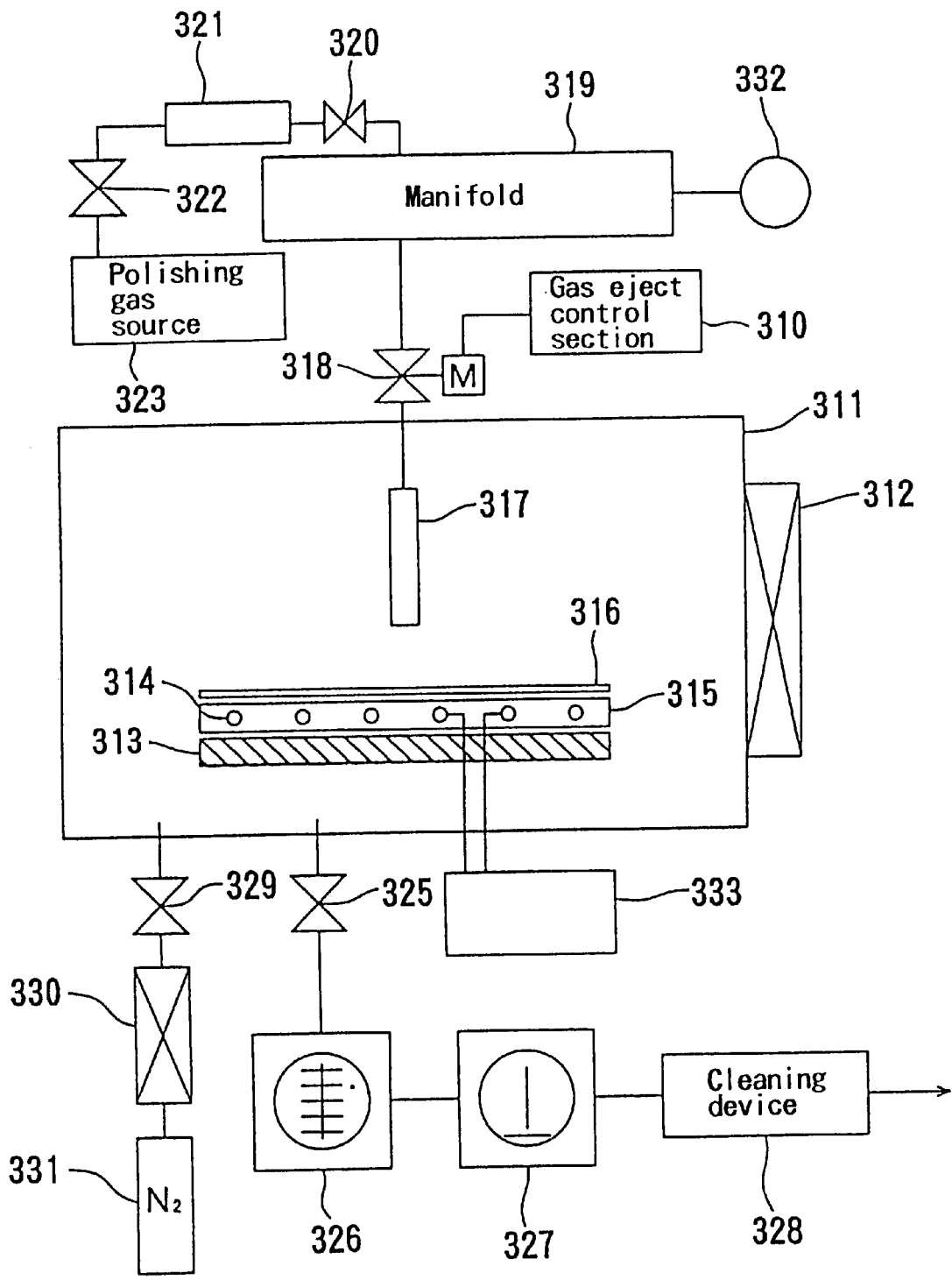
FIG. 23 is a schematic diagram of an apparatus to perform the gaseous polishing method of the present invention.

FIG. 23 shows an arrangement of the gaseous polishing apparatus suitable for the method disclosed in the present invention. The apparatus is comprised by: a hermetic polishing chamber 311 having an (isolation) gate 312 for transporting a substrate base or workpiece in or out of the chamber 311; an x-y table 313 disposed inside the chamber 311 for moving a workpiece 316; a pedestal 315 for supporting the workpiece 316, having an internal heater 314, disposed on top of the x-y table 313.

The polishing chamber 311 has a gas eject nozzle 317, opposite to the workpiece 316, connected to a polishing gas source (for example, ClF$_3$ gas) 323 through an electromagnetic (electromagnetic) valve 318, a manifold 319, a valve 320, a filter 321, and a valve 322. Polishing chamber 311 is connected, through a valve 325, to a turbomolecular pump 326, a roots pump 327 and a cleaning device 328. Also, a nitrogen gas (N$_2$) source 331 is connected through a valve 329 and a filter 330 to the polishing chamber 311.

The apparatus also includes a gas eject control section 310 to enable a polishing gas to be supplied in a pulse form to the eject nozzle 317 by controlling the operation of electromagnetic valve 318; a pressure gage 332 for measuring the gas pressure inside the manifold 319; and a heater power source 333 for supplying electrical current to the heater 314.

This polishing apparatus is operated as follows. First, the gate 312 is opened and the workpiece 316 is placed on the pedestal 315, and the gate 312 is closed. Next, the valve 325 is opened and the roots pump 327 is operated to evacuate the polishing chamber 311 to a pressure of $10^{-1}$~$10^{-2}$ torr. A polishing gas from the polishing gas source 323 is supplied through the valve 322, filter 321, valve 320 to the interior of the manifold 319. The internal pressure in the manifold 319 is 400~2280 torr. Turbomolecular pump 326 is not always necessary depending on the conditions for polishing.

Figure 24:
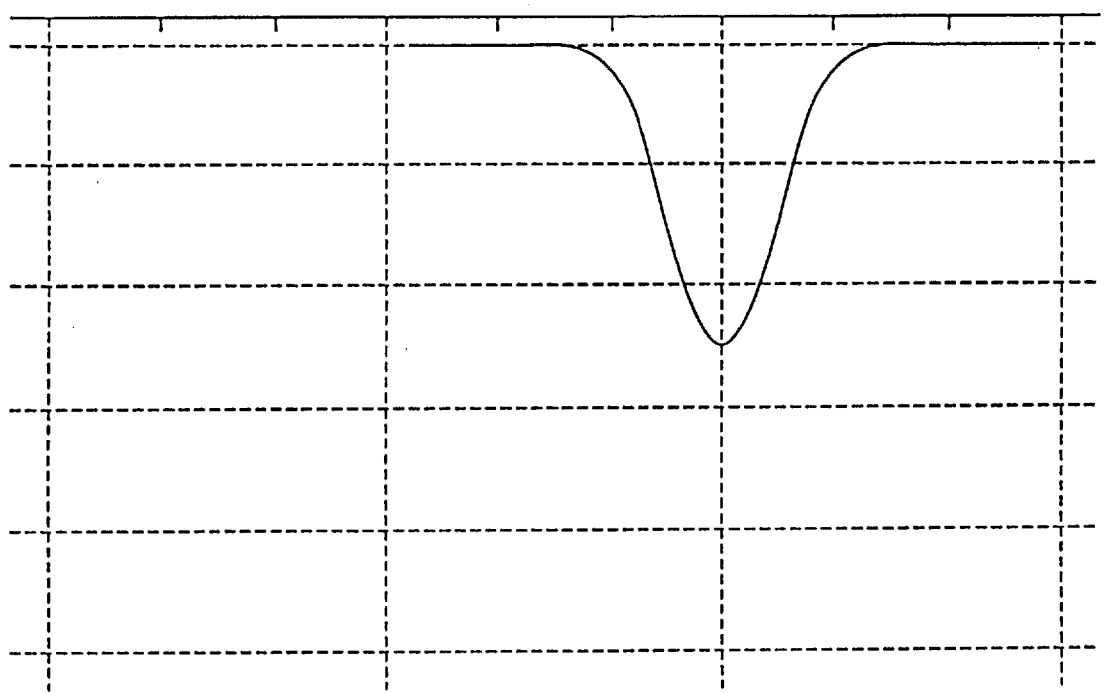
FIG. 24 is an example of the surface profile.

Gas eject control section 310 controls the electromagnetic valve 318 to open for 0.1~10 seconds to send the polishing gas inside the manifold 319 into the eject nozzle 317 to expose the workpiece 316 to a pulse of polishing gas ejected from the nozzle 317 at a high speed (a sonic speed, for example). In this case, by maintaining the chamber pressure at $10^{-1}$~$10^{-2}$ torr and increasing the exhausting speed, a surface profile similar to a curve of normal distribution illustrated in FIG. 24 is produced at a target location.

Figure 25:
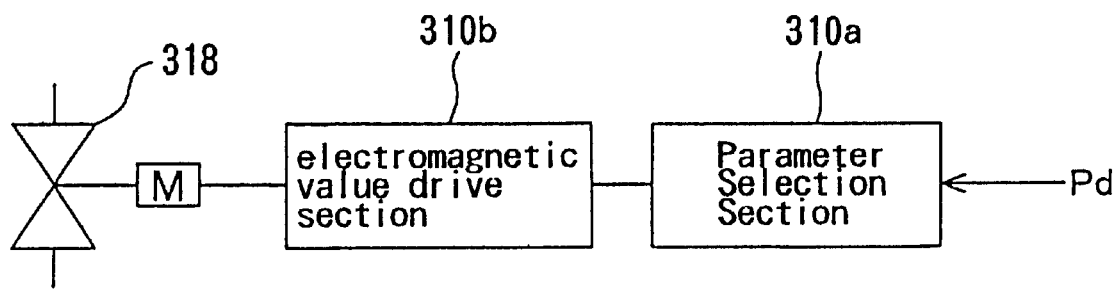
FIG. 25 is an example of a gas eject device.

The depth of the etched valley can be increased by increasing the frequency of opening the electromagnetic valve 318 under control of the gas eject control section 310, i.e., by increasing the number of pulses. Depending on the depth Pd of the etched valley, the gas eject control section 310 controls the duration of opening the electromagnetic valve 318 and the number of times it is opened, according to polishing parameters selected by the parameter selection section 310a, shown in FIG. 25, and operates the electromagnetic valve 318 through an electromagnetic valve drive section 310b, according to the parameters specified by the parameter selection section 310a.

When one location is completely polished, the workpiece 316 is moved by the x-y table 313 to a next polishing location so that the workpiece 316 will be directly under the eject nozzle 317, and the polishing process is repeated as above. The polishing process is repeated as above. The polishing process is repeated for all the locations to be polished on the workpiece surface. When all the intended locations have been polished, the polishing chamber 311 is evacuated until a sufficient degree of vacuum is reached, and the valve 325 is closed, and nitrogen gas is introduced from the nitrogen source 331 through the filter 330 until the pressure inside the polishing chamber 311 reaches atmospheric pressure. Then, the gate 312 is opened, and the polished workpiece 316 is transported out. Although the workpiece 316 was moved by moving the x-y table 313 in this example, the workpiece 316 may be left stationary while the gas eject nozzle 317 is moved to a location to be polished. It is also permissible to move the workpiece as well as the gas eject nozzle.

FIG. 26 shows an example of a set of polishing conditions. In this case, the surface to be polished is a poly-silicon film formed on a silicon wafer, the polishing gas is a mixture of ClF$_3$ and Ar in a ratio of 1:2. The flow rate of polishing gas is 90 mL during a polishing duration (pulse duration) of 0.6 seconds, the distance between the nozzle tip and the substrate is 1 mm, nozzle diameter is 6 mm, the substrate temperature is 50° C., and exhaust velocity is 1,000 L/min. The depth of etching produced by one eject pulse under these conditions is about 1,000 angstroms.

Figure 27A:
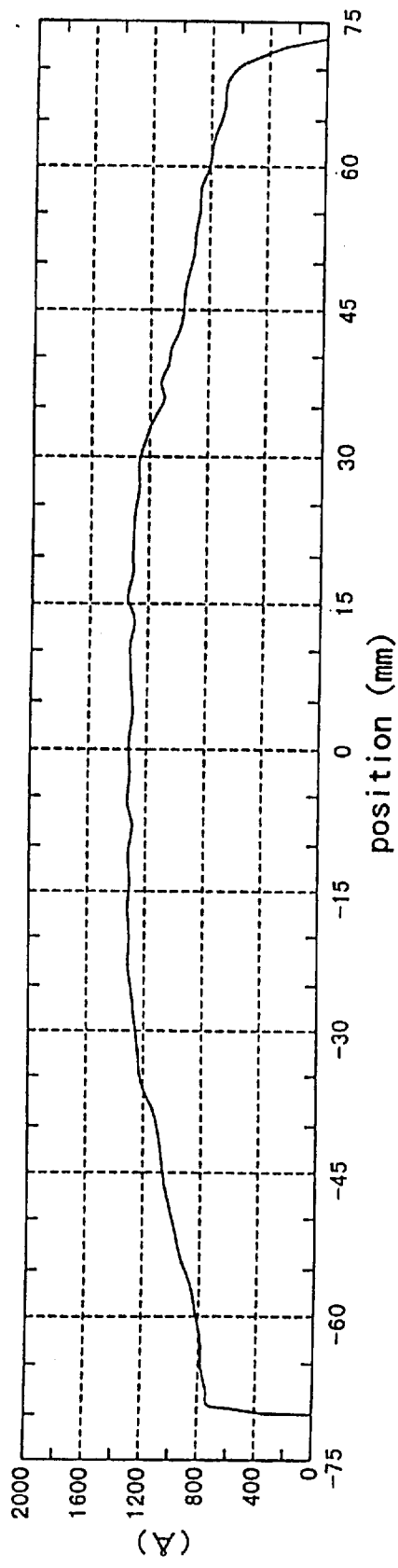
FIGS. 27A, 27B are examples of surface profiles of a polished poly-Si film.
Figure 27B:
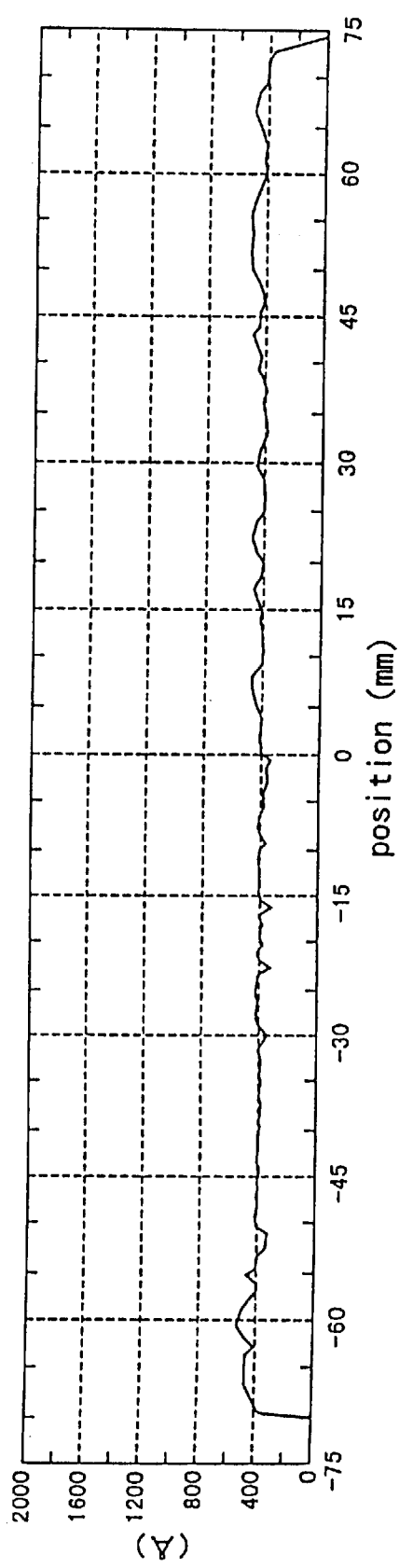

FIG. 27A shows the original surface profile of a poly-silicon film formed on a silicon wafer, having a surface undulation ranging from 400 to more than 1,200 angstroms. The result of exposing this curved surface to pulses is shown in FIG. 27B, indicating that the undulations have been polished to produce a flat profile varying in a narrow range of 400 angstroms.

Figure 28:
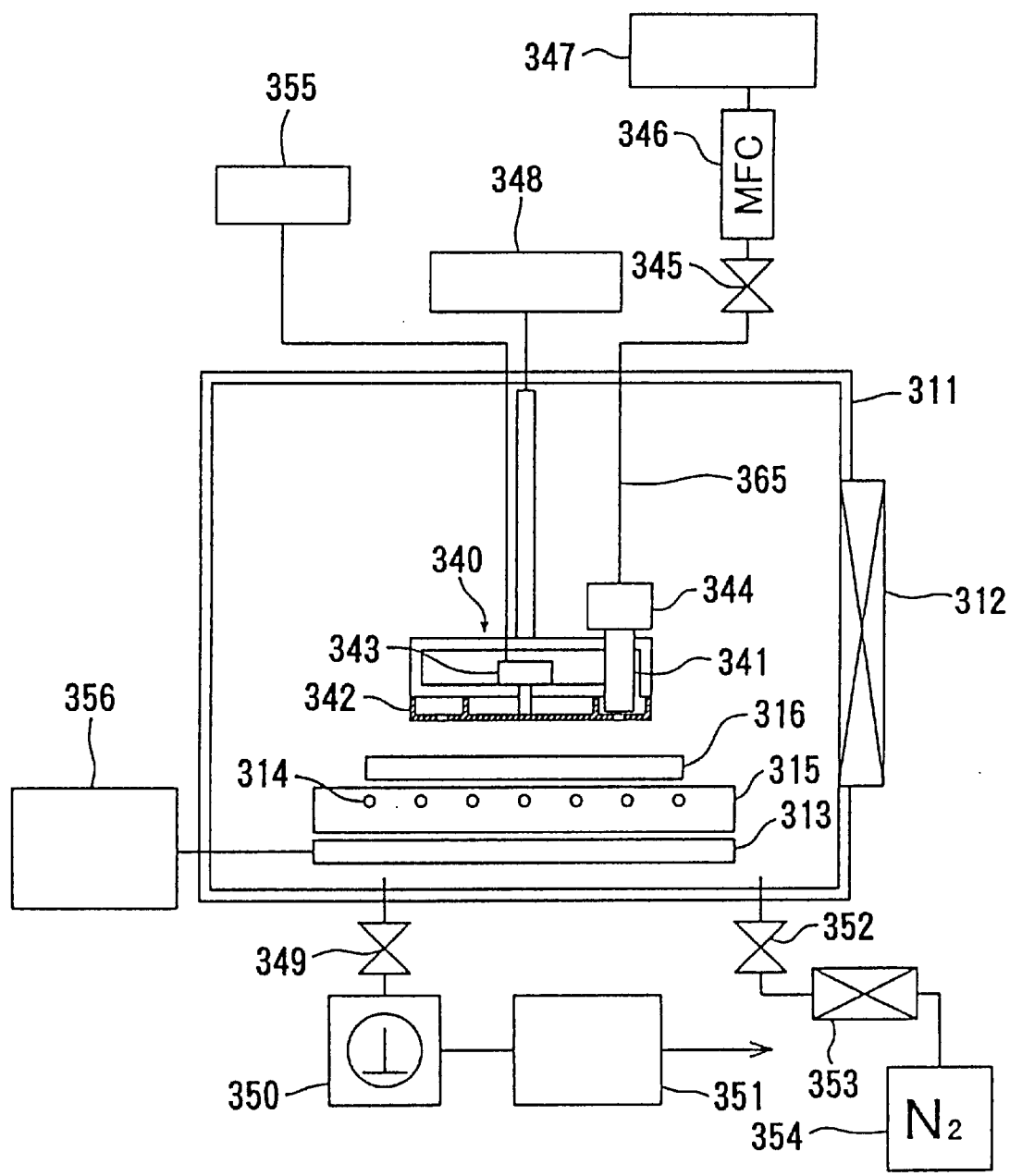
FIG. 28 is an example of the arrangement of a gaseous polishing apparatus.

FIG. 28 shows an example of a gaseous polishing apparatus comprised by, as in the case shown in FIG. 23: a gate 312 for transporting a workpiece 316 into a polishing chamber 311; an x-y table 313, a pedestal 315 with an internal heater 314 for supporting a workpiece 316; and a gas eject device 340 opposite to the workpiece 316 all disposed inside the polishing chamber 311. Gas eject nozzle device 340 is movable in the z-direction (vertical) by means of a drive control section 348.

The gas eject device 340 is provided with a nozzle 341 and a rotating nozzle plate 342 disposed on the bottom end of the nozzle 341 and having gas openings separated at a given distance. The rotating nozzle plate 342 is rotated by a motor 343. A gas reservoir 344 is provided in an upstream location of the nozzle 341, and is supplied with a polishing gas (for example, ClF$_3$) at a constant pressure (400~2,280 torr) from a polishing gas source 347 through an MFC 436, a valve 345 and a flexible tube 365.

In FIG. 28, a gas eject control section 355 controls gas eject parameters, such as eject cycles, of pulse output ejected from the nozzle 341 by controlling the speed of the motor 343, and a drive section 353 controls the x-y table 313. Gas eject control section 355 controls the rotational speed of the motor 343, and pulses of the polishing gas are ejected periodically from the nozzle 341 at a high speed.

Figure 30A:
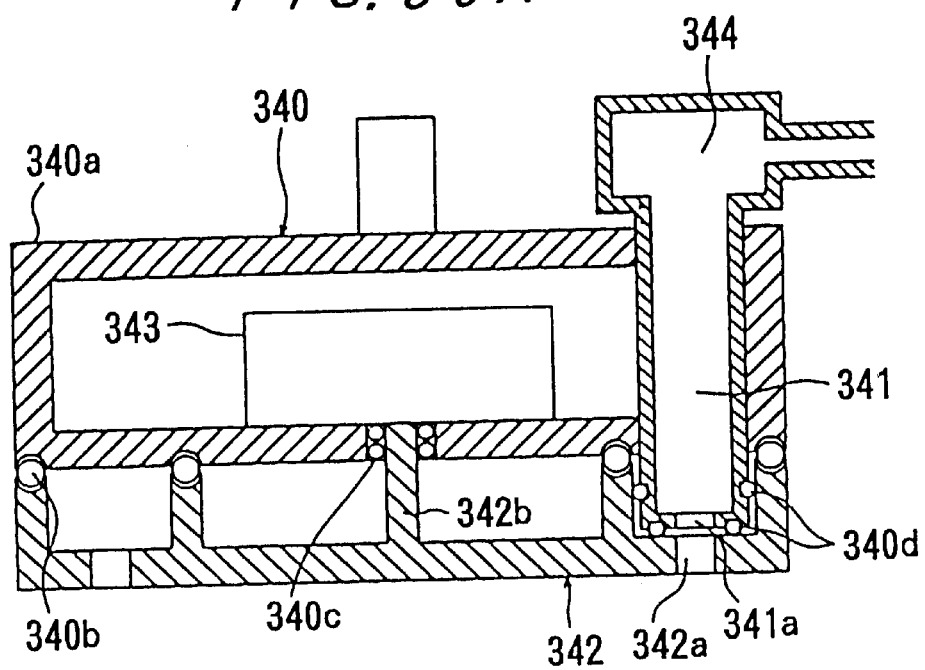
FIGS. 30A, 30B are, respectively, a cross sectional view and a plan view showing detailed structure of the gas eject device.
Figure 30B:
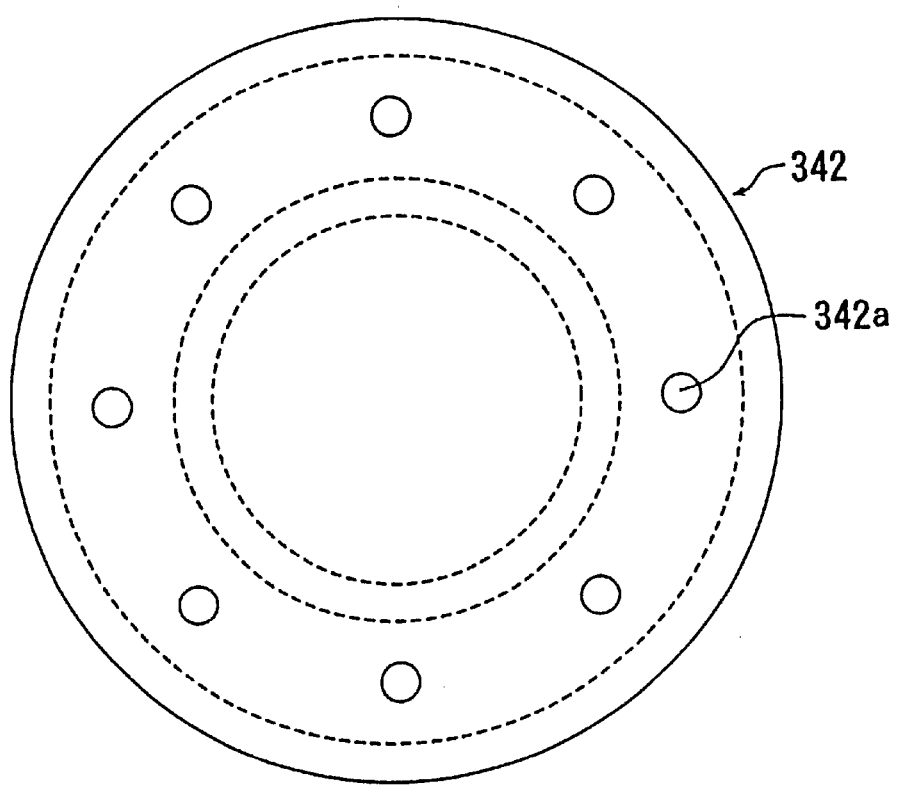

FIG. 30 shows the structural details of the gas eject device 340, and FIG. 30A is a cross sectional view and FIG. 30B is a plan view of the rotating nozzle plate 342. Rotating nozzle plate 342 is comprised of a circular plate having a plurality of gas openings 342a provided at equal separation. The plate 342 is attached, with intervening bearings 340b, to a bottom surface of frame member 340a of the gas eject device 340, and is rotated about rotational shaft 342b by motor 343.

Nozzle 341 is located at a certain location of the frame member 340a, and when the rotating nozzle plate 342 is rotated by the motor 343 so that the gas opening 342a and gas eject opening 341a of nozzle 341 become aligned, the polishing gas stored under pressure in gas reservoir 344 is discharges as pulses. The rotation shaft 342b is supported by a bearing 340c, and the space between the rotating nozzle plate 342 and the nozzle 341 is sealed by O-rings 340d.

When electromagnetic valve 318 provided outside the polishing chamber 311 as shown in FIG. 23 is used to control the supply of polishing gas to the nozzle 317, the space between the electromagnetic valve 318 and the tip of the nozzle 317 constitutes a long dead space, and it takes a certain length of time for the polishing gas to travel this dead space. The result is a delay in delivering the pulse produced by the actions of opening/closing the electromagnetic valve 318, and a long delay in action, expressed as a dead-timeband (DTB), is generated as indicated by line B shown in FIG. 29. This presents a problem of lack of responsibility for the gaseous polishing apparatus.

Figure 29:
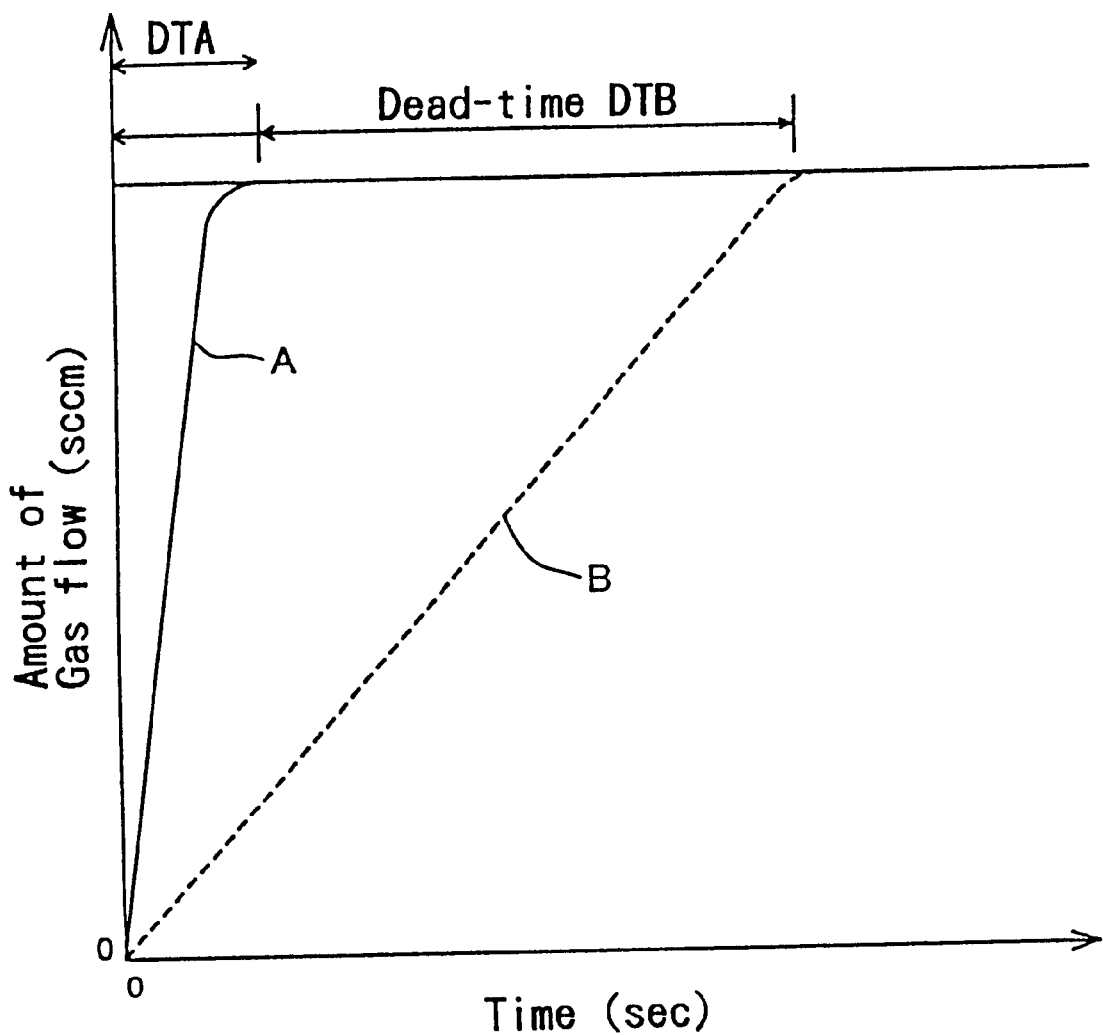
FIG. 29 is a graph showing the flow response of polishing gas after a valve is opened.

On the other hand, in the apparatus shown in FIG. 28, because the rotating nozzle plate 342 acting as a eject control valve is located at the tip of the nozzle 341, the long dead space is virtually eliminated, and the DTB is extremely short, as indicated by line A in FIG. 29. Therefore, ejecting of polishing gas is carried out uniformly quickly, thus making it possible to remove local structural irregularities efficiently and with precision.

Figure 31:
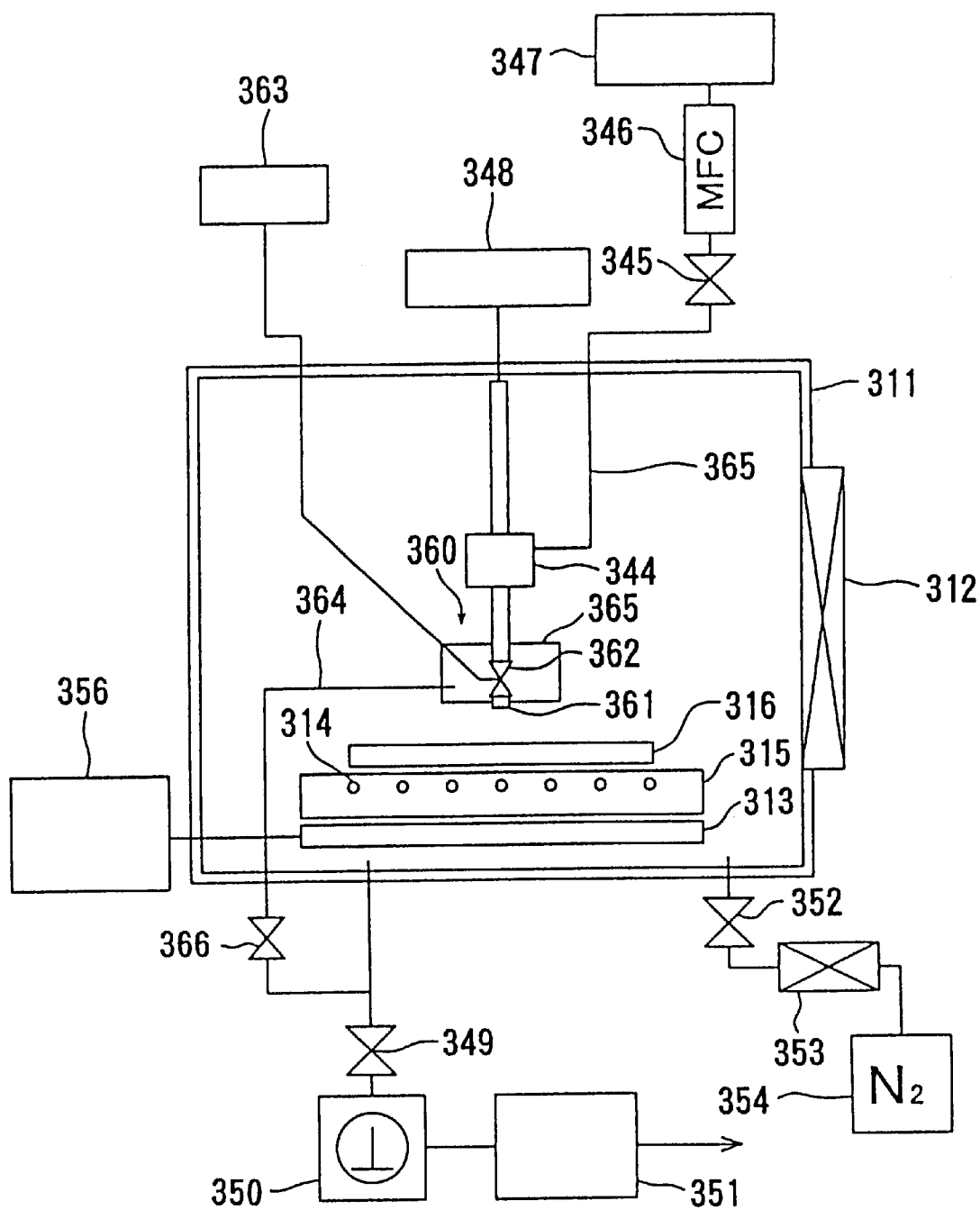
FIG. 31 is a schematic diagram of an overall view of a gaseous polishing apparatus.

FIG. 31 shows another example of the arrangement of the gaseous polishing apparatus, presenting a different feature, compared with the apparatus shown in FIG. 28, with an electromagnetic valve 362 in gaseous polishing apparatus 360 provided on nozzle 361. Other aspects of the apparatuses are the same in both cases. A gas reservoir 344 is provided upstream of the nozzle 361 having the electromagnetic valve 362, and pulsed ejections are produced by opening/closing action of the electromagnetic valve 362 under the control of gas eject control section 363.

By providing the electromagnetic valve 362 for opening and closing the nozzle 361, the dead space between the gas reservoir 344 and the tip of nozzle 361 is virtually eliminated, and the pulsed ejections are produced in quick response to opening/closing actions of the electromagnetic valve, as in the case of the apparatus shown in FIG. 28, to enable removing surface irregularities from the polishing surface with precision. It should be noted that a suction hood 365 is provided to be connected to exhaust pipe 364 and an exhaust valve 366 to a vacuum pump 350. This exhaust passage is used to remove excess polishing gas to prevent polishing of areas other than the targeted local area, thereby producing the degree of etching precision required by the apparatus.

FIG. 32 shows an example of a polishing facility to perform gaseous polishing and CMP processes continually. The polishing facility is comprised by a gaseous polishing apparatus 371, a CMP apparatus 372, a robot chamber 373 and a transport chamber 374. The transport chamber 374 and the robot chamber 373 are connected by an (isolation) gate 375, robot chamber 373 and gaseous polishing apparatus 371 by a gate 376, and CMP apparatus 372 and robot chamber 373 by a gate 377.

In this facility, robot 379 in the robot chamber 373 transports a workpiece 378 into the transport chamber 374, and into the gaseous polishing apparatus 371 through the gate 376, robot chamber 373 and the gate 377 to perform gaseous polishing. When the gaseous polishing process is completed, the gas polished workpiece 378 is picked up by the robot 379 and is transported into the CMP apparatus 372 through the gate 376, robot chamber 373 and gate 377 to perform chemical/mechanical polishing. Further, the robot 379 picks up the CMP processed workpiece 378, and transports the workpiece 378 back into the transport chamber 374 through the gate 377, robot chamber 373 and gate 375.

According to the apparatus presented above, a gaseous polishing process and a CMP process are carried out continually without having to expose the polished surface to outside atmosphere between the processes, thereby achieving a high degree and quality of polishing precision that could not have been provided by conventional systems. When the gaseous polishing or CMP process is completed, the workpiece is subjected to washing and drying operations, but the facilities for these operations are not shown. Any of the gaseous polishing apparatuses described above may be used as gaseous polishing apparatus 371.

A gaseous polishing process and a CMP process need not be carried out adjacent to one another as described above. These processes may be carried out in separate apparatuses, so that gas polished workpieces may be transported to the CMP apparatus, one at a time or in a group so long as proper procedure is maintained to prevent degradation of the gas polished surface of the workpieces.

Figure 33:
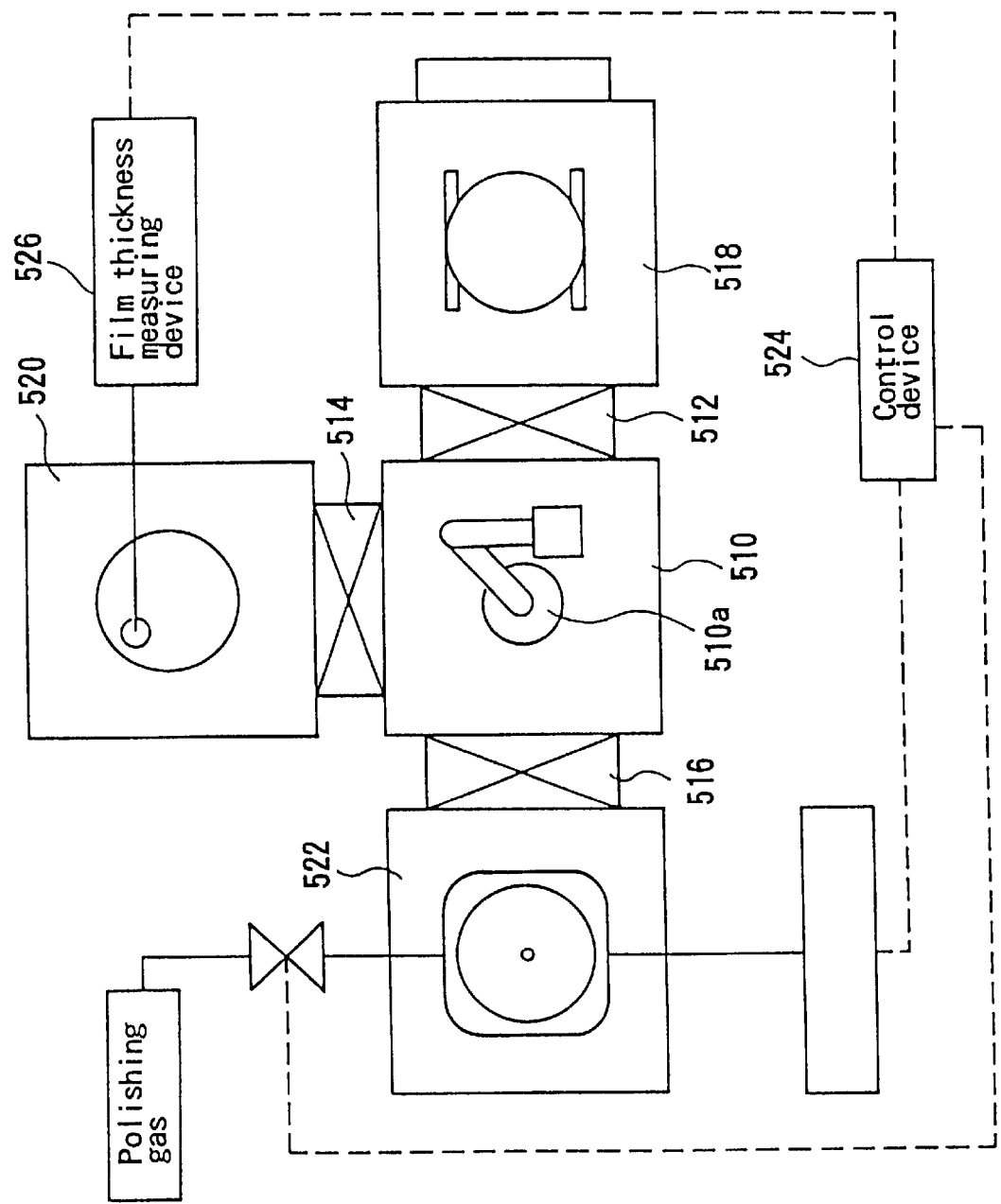
FIG. 33 is a plan view of an example of a gaseous polishing facility using the gas eject nozzle of the present invention.
Figure 34:
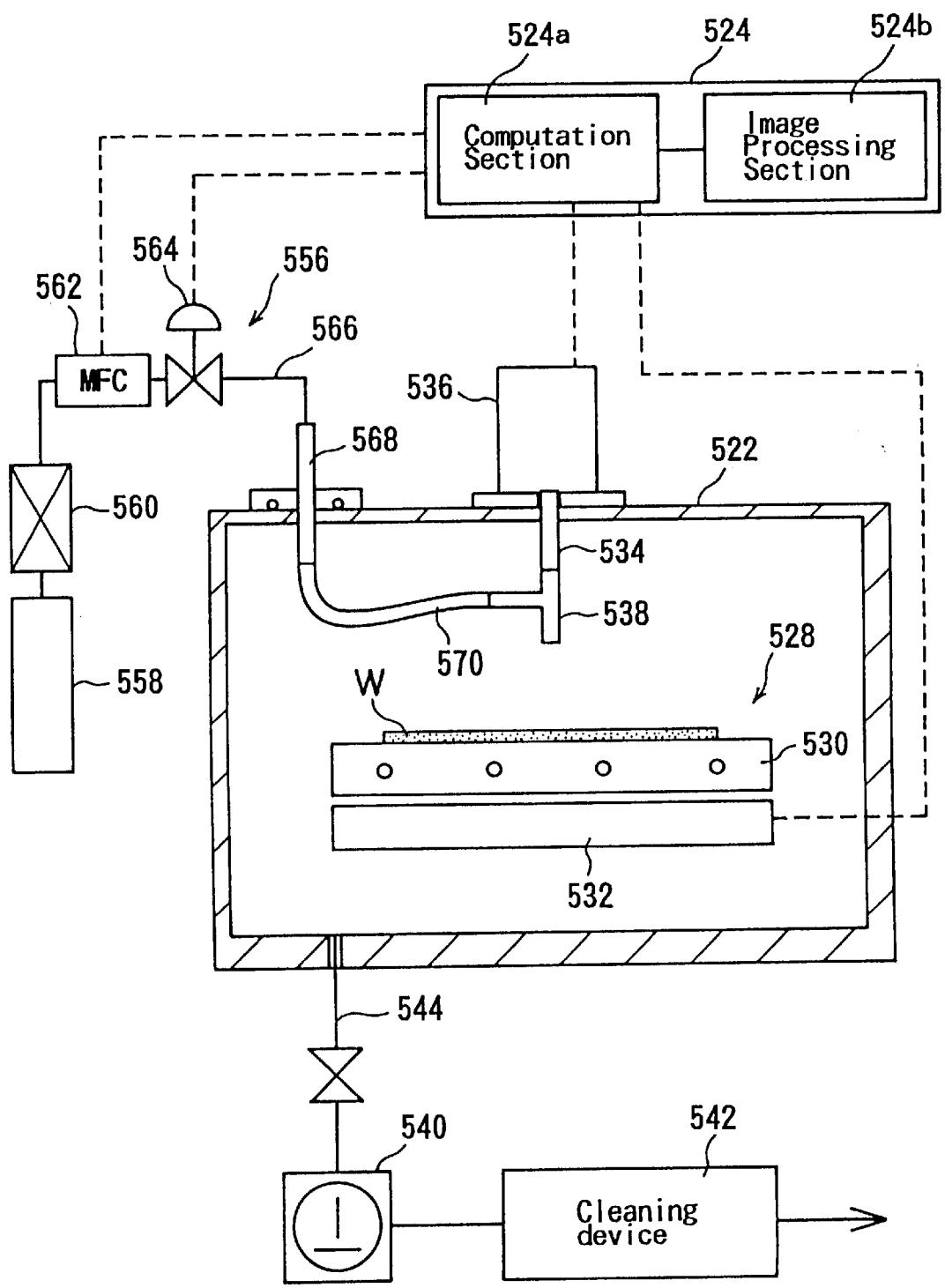
FIG. 34 is a cross sectional view of the gaseous polishing facility shown in FIG. 33.

FIGS. 33 and 34 show another embodiment of the polishing facility and a gaseous polishing apparatus for the facility, respectively. As shown in FIG. 33, the polishing facility is comprised by four hermetic vacuum chambers including a central robot chamber 510; workpiece holding chamber 518; a film measuring chamber 520; a polishing chamber 522; connected through gate valves 512, 514, 516 to the robot chamber 510; and a process control apparatus for controlling the operations of each component device as well as the overall operation of the polishing facility. The film measuring chamber 520 may include, for example, a remote distance sensor for determining the distance to the workpiece W, an eddy current film thickness sensor, and a film thickness measuring device 526 by scanning the polishing surface with an ellipsometer to produce digitized data of the fine surface structures.

As shown in FIG. 34, the polishing chamber 522 is provided with a central holding table 528 for supporting workpiece W and including a heater 530 for maintaining the workpiece W at a constant temperature, and an x-y table 532 for moving the workpiece W to a specific location within the chamber 522. A nozzle 538, supported on a support shaft 534 of an external elevator 536, is provided at a specific height above the holding table 528. Polishing chamber 522 is connected to a vacuum pump 540 for evacuating the chamber 522 to a given vacuum, an exhaust passage 544 to lead the exhaust gas to a cleaning device 542 for removing pollution components, a purge gas supply passage for supplying a purge gas when necessary, a vacuum sensor for detecting the chamber vacuum, and a temperature sensor (not shown) to determine the workpiece temperature.

Figure 35A:
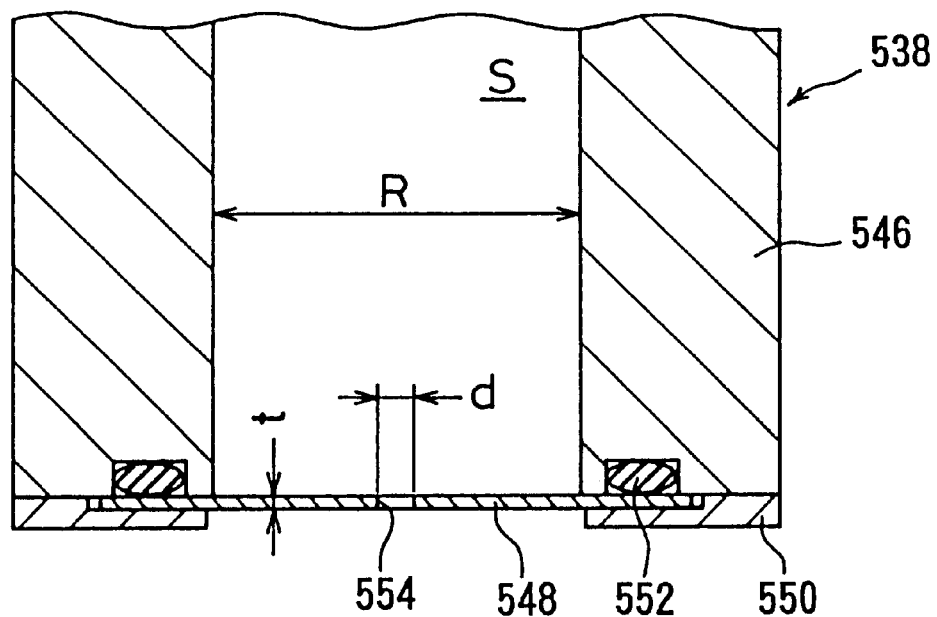
FIGS. 35A, 35B are, respectively, a cross sectional view and a bottom view of the tip of a gas eject nozzle.
Figure 35B:
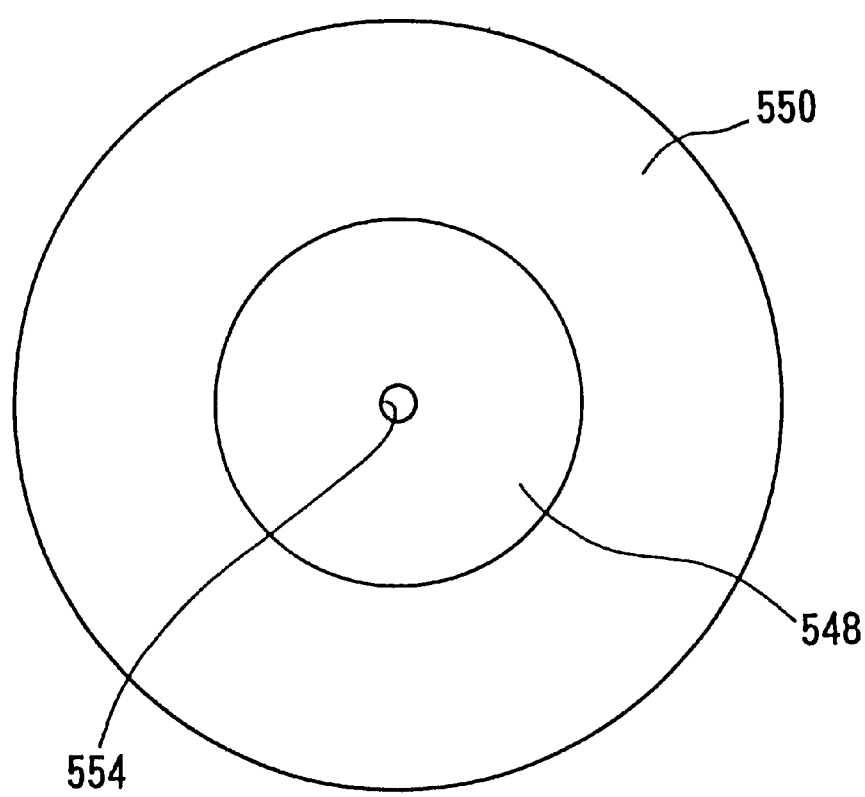

As shown in FIGS. 35A, 35B, the nozzle 538 is comprised by a tube member 546 of an inner diameter R and a shutter disc member 548 made of a thin disc bolted to the end of the tube 546 with a ring plate 550, and forming a gas passage S enclosed in the tube member 546. An O-ring seal 552 is provided to maintain gas tightness between the tube member 546 and the shutter disc member 548. In the center of the shutter disc member 548, there is a gas hole 554 of a diameter d of a size smaller than the inner diameter R. It is preferable that the thickness t of the shutter disc member 548 be small to decrease the resistance to flow of exhaust gas, but if it is too thin, strength and corrosion resistance are decreased. Therefore, the range of preferred thickness is 10 mm<t<1,000 mm, for example, and more preferably, 30 mm<t<500 mm.

In this example, gas supply device 556 is comprised by a gas source 558 containing a pre-mixed polishing gas made up of a reactive gas such as $ClF_3$ and an inert gas such as Ar; a filter 560, a mass flow control device (MFC) 562; a supply pipe 566, having an electromagnetic valve 564, connected to a feed-through 568 to deliver mixed gas into the polishing chamber 522, and ultimately to the nozzle 538 through a flexible tube 570. The MFC 562 and valve 564 are connected to a computation control section 524a of a control device 524, which also controls x-y table 532 and elevator 536, to deliver a certain flow of polishing gas to polish various polishing locations on the workpiece W.

In this embodiment, polishing gas is supplied not in a continuous stream but in pulses by opening the shutter valve 564 periodically. By so doing, the polishing gas supplied to the target location reacts in an instant with the surface of the workpiece W but is dispersed immediately to provide polishing of only the targeted location. Pulsed ejection facilitates control of the amount of polishing gas supplied to the location, but it is permissible to supply the polishing gas continually if so desired.

Next, the process of planalization of the workpiece W using the above described gaseous polishing apparatus will be explained. The workpiece W is transported from the holding chamber 518 to the film measuring chamber 520, which performs measurements of film thickness over the entire surface of the workpiece W using the film thickness measuring device 526, and the measured distribution data of the film thicknesses are stored in an image processing section 524b in the process control device 524.

The computation section 524a of the control device 524, which also controls x-y table 532 and elevator 536, to deliver a certain flow of polishing gas to polish various polishing locations on the workpiece W.

In this embodiment, polishing gas is supplied not in a continuous stream but in pulses by opening the shutter valve 564 periodically. By so doing, the polishing gas supplied to the target location reacts in an instant with the surface of the workpiece W but is dispersed immediately to provide polishing of only the targeted location. Pulsed ejection facilitates control of the amount of polishing gas supplied to the location, but it is permissible to supply the polishing gas continually if so desired.

Next, the process of planalization of the workpiece W using the above described gaseous polishing apparatus will be explained. The workpiece W is transported from the holding chamber 518 to the film measuring chamber 520, which performs measurements of film thickness over the entire surface of the workpiece W using the film thickness measuring device 526, and the measured distribution data of the film thicknesses are stored in an image processing section 524b in the process control device 524.

The computation section 524a of the control device 524 determines the amount of polishing required in the various locations of the workpiece. For example, if it is desired to produce a flat surface on the workpiece W, polishing parameters such as the rate of flow and concentration of the polishing gas flowing through the nozzle 538 and the duration of polishing (pulse count) are determined according to the height of undulations existing at the various locations on the mapped polishing surface.

Next, the workpiece W is transported by the robot 510a into the polishing chamber 522, where it is polished according to the parameters described above. First, the polishing chamber 522 is evacuated to a desired vacuum, and the substrate is heated to a suitable temperature using the heater 530, and the height of the nozzle above the workpiece W is adjusted according to the details of the structure to be polished and the parameters. In this case, the height of the workpiece W may be adjusted to a suitable value.

The polishing surface is scanned by moving the x-y table in such a way that the target location of the workpiece W will be successively brought directly under the nozzle 538. Then, the polishing gas is ejected from the nozzle 538 according to the pre-determined parameters in the film thickness table in the stored data of the mapped surface 572, as shown in FIG. 36. Polishing gas may be ejected continually while the workpiece W and the nozzle 538 are being moved relative to the other, or the workpiece may be stopped momentarily below the nozzle 538.

In this process, the polishing gas passes through the shutter valve 564, supply pipe 566, flexible tube 570, and the gas passage S in the nozzle 538, and is constricted by the small gas hole 554, and is ejected to the target location of the workpiece W to produce precision polishing of the target location. High flow resistance is encountered only in the low conductance gas passage region through the gas hole 554, and therefore, compared to a fine capillary nozzle shown in FIG. 43, there is little delay in responding to a control action.

After performing cleaning and drying of a polished workpiece as necessary, the polished workpiece is returned by robot 510a to the film thickness measuring chamber 520 to re-measure the film thickness. When the surface flatness is outside the allowable range, polishing is repeated, but when the flatness is within the allowable range, it is placed in the holding chamber 518. It is permissible to transfer the gas polished workpiece to a CMP process, as described in the embodiment shown in FIG. 32, to produce a final polished surface.

In this example, the workpiece W was moved to scan the surface 572, but the nozzle may be moved in the x-y direction. The manner of moving the nozzle 538 with respect to the workpiece W is not limited to x-y directions, such that any suitable combination of movements produced by rotation and linear translation is acceptable.

Figure 37:
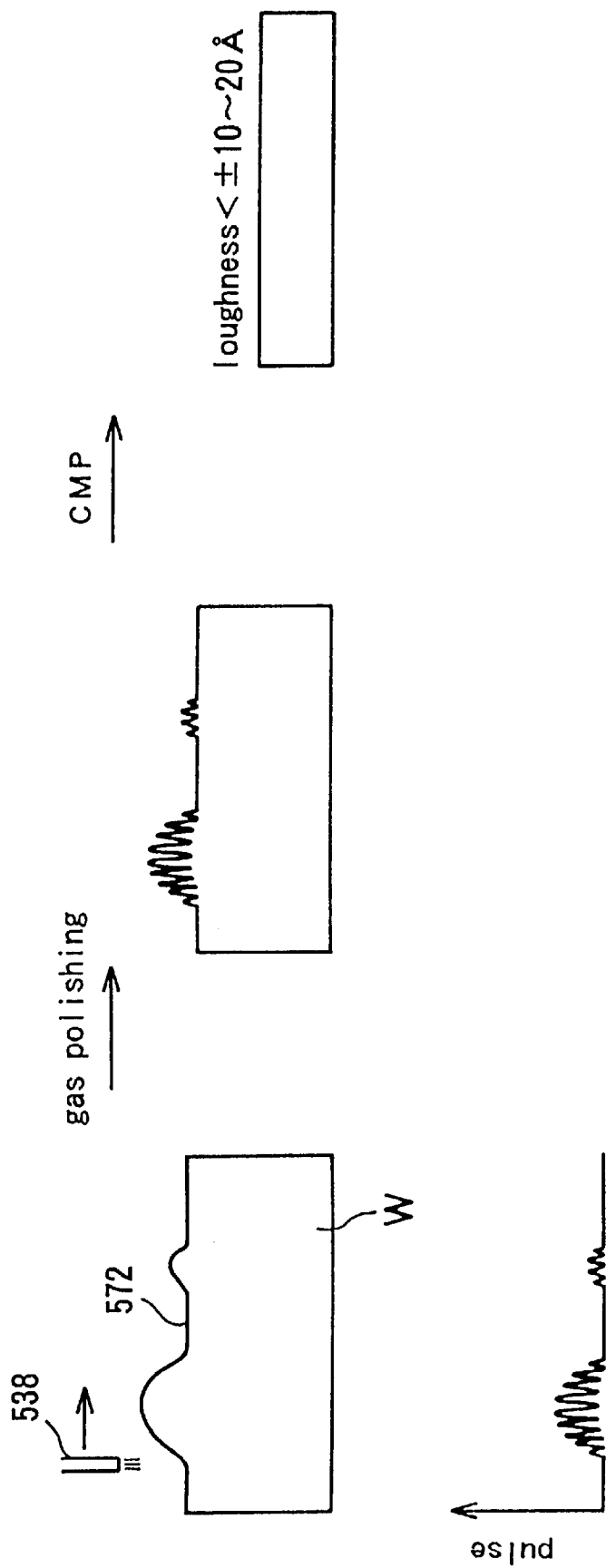
FIG. 37 is an illustration changes in a surface profile in another gaseous polishing process.

FIG. 37 shows another process of gaseous polishing using pulsed ejections to improve the overall polishing efficiency. In this process, nozzle performs local polishing on one location and moves to another location to repeat the process. The result is a surface 572 containing macroscopic undulations in their original locations, but each undulation has now been etched to result in microscopic serration as illustrated in FIG. 37.

When such a gas polished surface is subjected to a subsequent CMP process, microscopic serrations as well as macroscopic undulations are removed to produce a polished surface having an excellent flatness. Combining the two types of polishing processes thus improves the efficiency of precision polishing. The nozzle may be moved continuously in the x-direction while stopping at a series of discrete locations in the y-direction.

FIGS. 38A, 38B show another configuration of attaching a shutter disc member 548 to a tube member 546 of the nozzle 538. A fixed section 574, comprised by a ring plate 574a and an integral tube section 574b having threads 575 formed on the inner surface, is screwed to the outer periphery of the tube section 546 of the nozzle 538 to improve the tightness of sealing and handling of the nozzle tip structure.

Figure 39:
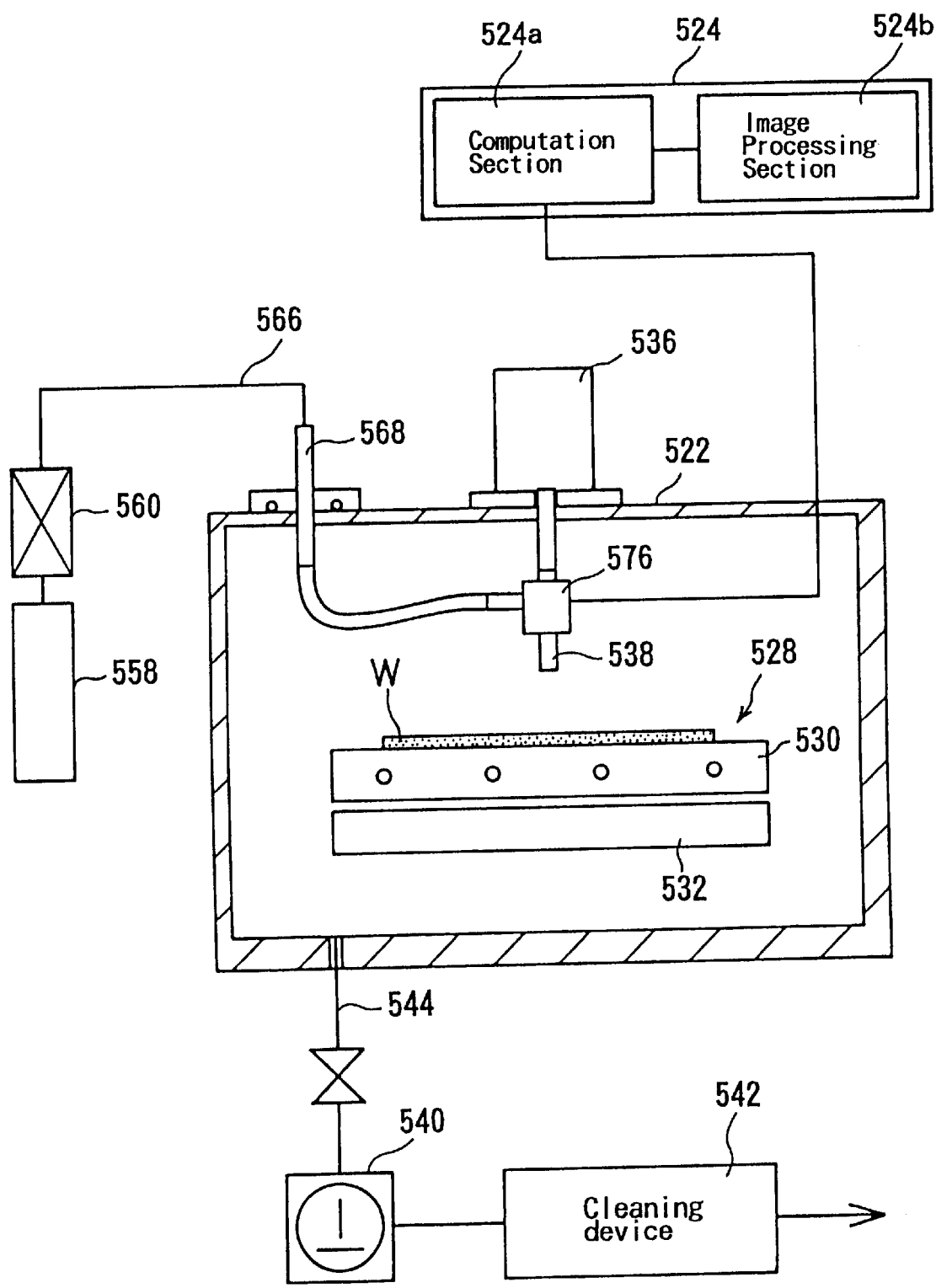
FIG. 39 is a cross sectional view of another example of the gaseous polishing chamber.

FIG. 39 shows another embodiment of the gaseous polishing apparatus based on the present design of the nozzle 538. Gas control section 576 having an MFC and an electromagnetic valve is integrated with the nozzle 538. According to this design, opening and closing actions of the nozzle 538 can be performed closer to the tip end of the nozzle 538 so as to prevent excess polishing caused by leaking of residual gas remaining in the space between the shutter valve 564 and the nozzle tip after the closure of the valve.

Figure 40A:
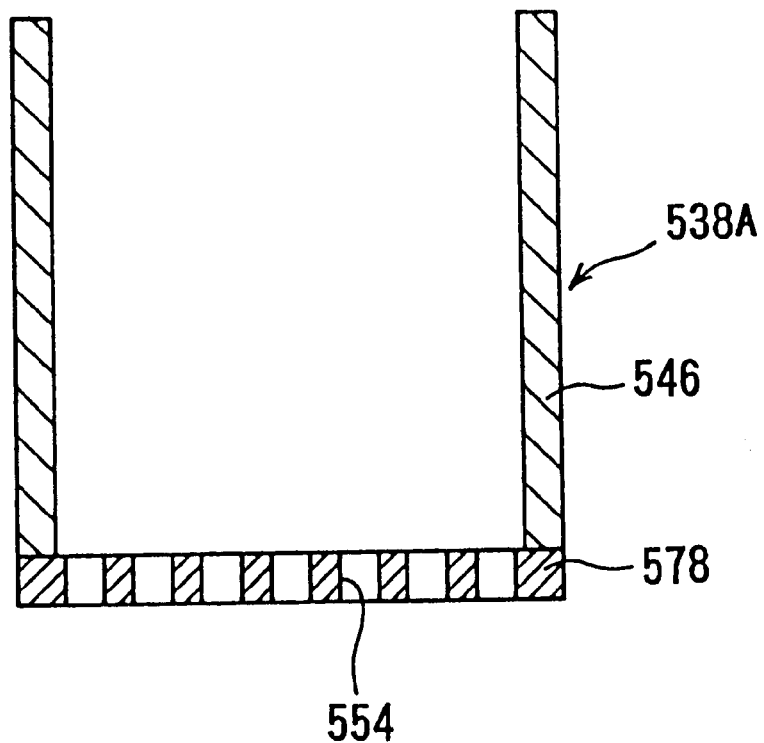
FIGS. 40A, 40B are, respectively, a cross sectional view and a bottom view of another gas eject nozzle.
Figure 40B:
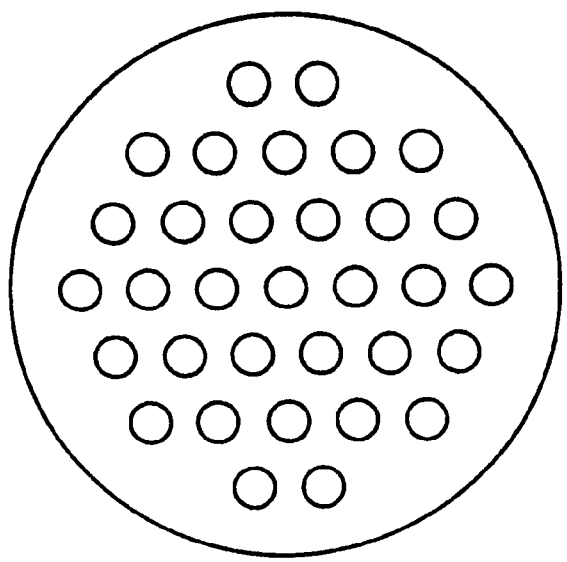
Figure 41A:
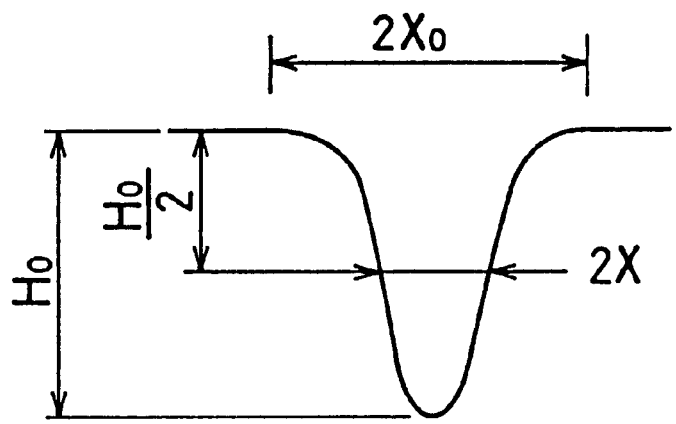
FIGS. 41A, 41B are views of surface profiles produced by, respectively, one gas eject nozzle, and a plurality of nozzles.
Figure 41B:
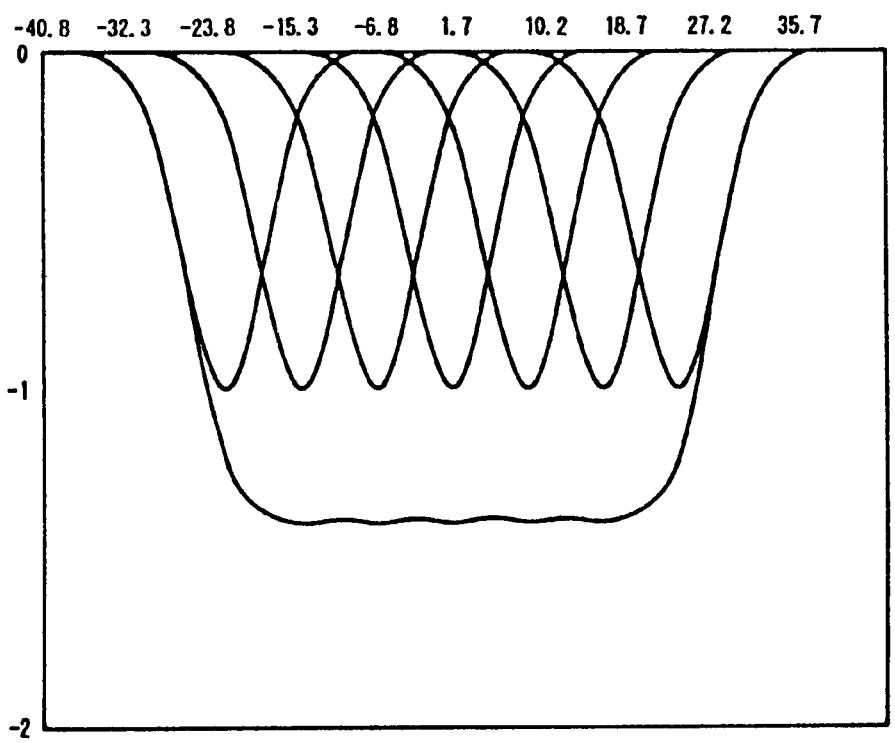

FIGS. 40A, 40B show a cross sectional view and a plan view of another embodiment of the nozzle. This nozzle 538A has one shield plate 578 provided with a plurality of gas holes 554. When many gas holes 554 are present adjacent to each other, an etched profile having many valleys shown in FIG. 41B is produced, compared with a case of an etched profile having only one valley shown in FIG. 41A produced by one large diameter nozzle. Therefore, when a relatively large area is to be planarized, it is more efficient to use a multi-hole nozzle rather than a single hole nozzle.

Figure 42A:
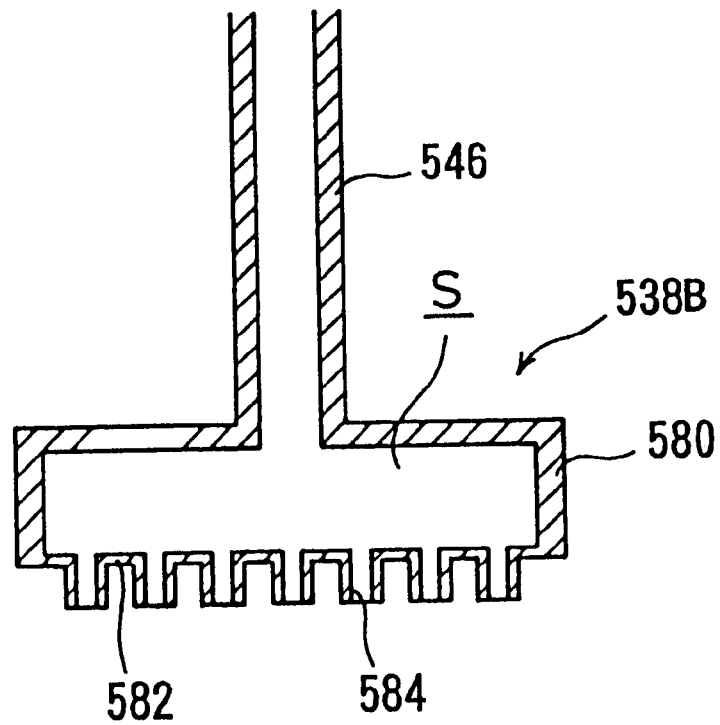
FIGS. 42A, 42B are, respectively, a cross sectional view and a bottom view of the tip of yet another gas eject nozzle.
Figure 42B:
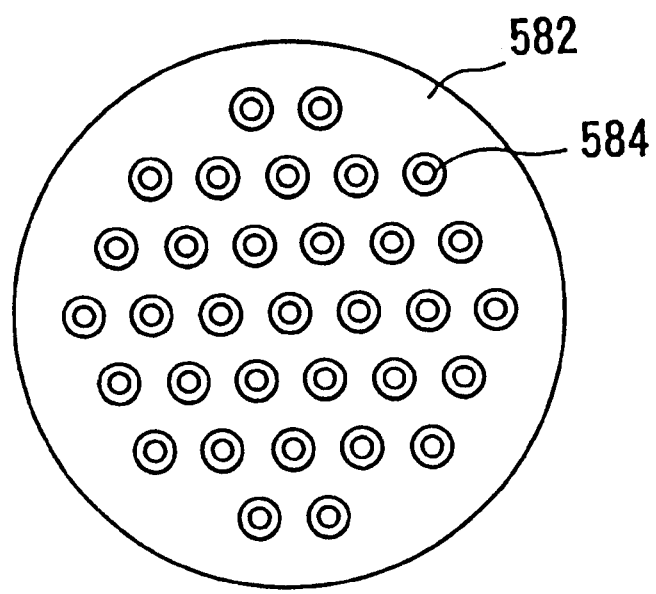

FIGS. 42A, 42B show a cross sectional view and a plan view of another embodiment of the nozzle. This nozzle 538B has a header 580 forming a disc shaped space S at the tip of tube section 546. Bottom plate 582 is provided with a plurality of short tubes 584. The advantage of this design compared with the one shown in FIGS. 40A–40B is that, because of the presence of the header space S, polishing gas can be supplied more uniformly over a large area compared to the nozzle shown in FIGS. 40A–40B.

Either of the multi-hole nozzles shown in FIGS. 40A–40B or 42A–42B can be used to perform a polishing methods illustrated in FIGS. 36 or 37.

Figure 44:
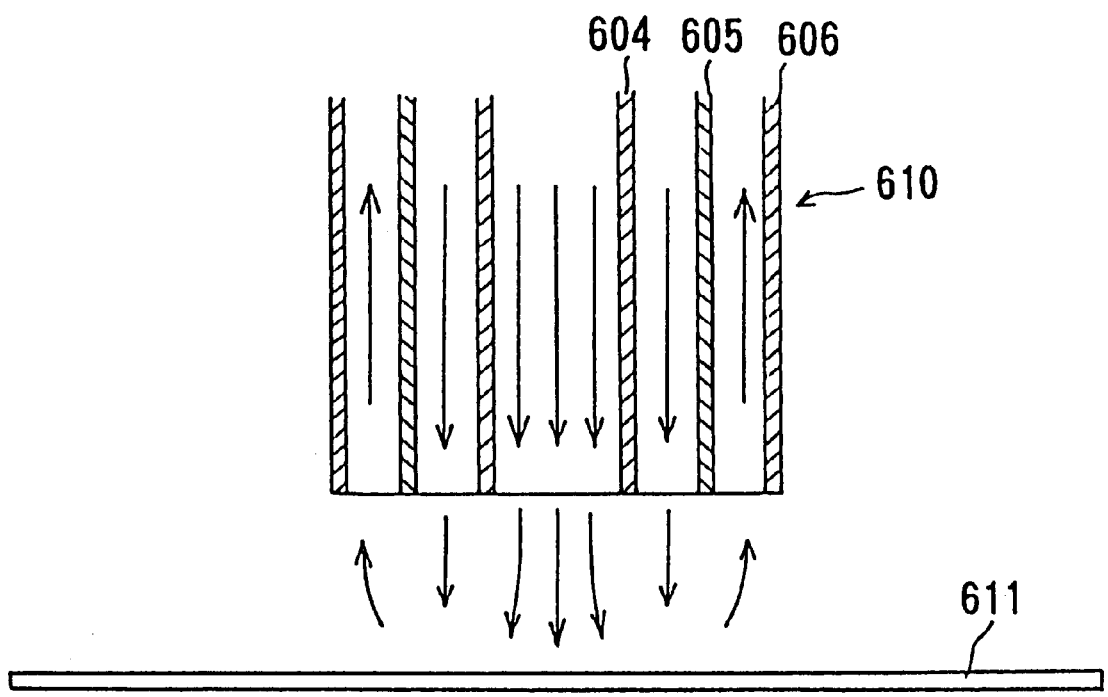
FIG. 44 is a schematic diagram of a gas eject nozzle of a gaseous polishing apparatus.

FIG. 44 shows another embodiment of the nozzle device according to the present invention. This nozzle device is comprised by a concentric triple tube structure (coaxial structure) 610 having an inner tube 604, middle tube 605 and an outer tube 606. The polishing gas is ejected through the inner tube 604, and inert gas or inactivating gas of the polishing gas is ejected through the middle tube 605. Excess of reaction gas including reacted product of the polishing gas, and inert gas or inactivating gas are exhausted through the outer tube 606. Instead, the polishing gas and inert gas or inactivating gas may be exhausted through the inner tube 604.

Therefore, according to such triple tube structure, reactive polishing gas which is ejected from the gas eject tube 604 toward workpiece surface 611, is surrounded by the inert gas or inactivating gas on the surface, then the gaseous polishing is carried out at a limited area on the polishing surface 611. Also, excess of the polishing gas is blown away by the inert gas or inactivating gas and instantly exhausted by the outer exhausting tube 606, thus preventing extraneous polishing of areas other than the targeted area, and defining a clearly localized profile of the polishing area.

The above described triple tube structure 610 or dual tube structure as shown in FIG. 20 may be employed with a combination of the various kinds of nozzle devices of the present invention.

It is obvious to those skilled in the art that the details disclosed in the above exemplary embodiments are given for illustrative purposes only. It should be noted that other variations of nozzle device structure and gaseous polishing apparatus are possible within the scope of the claims that follow.

What is claimed is:

1. A nozzle device for use in gaseous polishing of a surface of an object, said nozzle device comprising:
   a nozzle body having a nozzle opening at a downstream end thereof, said nozzle opening being operable to eject a polishing gas to the surface to be polished;
   a shutter device disposed in proximity to said nozzle opening, said shutter device being operable to allow ejection therefrom of the polishing gas to a local target area of the surface and to block the ejection; and
   a control mechanism operable to control operation of said shutter device and control the ejection of the polishing gas,
   wherein said shutter device is provided with a shield member disposed so as to shield areas of the surface to be polished other than the local target area from the polishing gas ejected from said nozzle opening, and said control mechanism comprises an attaching device attaching said shield member to an outer periphery of said nozzle body so as to be freely movable relative thereto.

2. A nozzle device as claimed in claim 1, wherein said shutter device has a gas ejection hole therein.

3. A nozzle device as claimed in claim 1, wherein said nozzle body comprises a tube member to be directed to the surface to be polished, and a header section at an upstream end of said tube member.

4. A nozzle device according to claim 1, wherein said control mechanism controls the ejection of the polishing gas to be in pulses, instead of in a continuous stream.

5. A nozzle device for use in gaseous polishing of a surface of an object, said nozzle device comprising:
   a first tube having at a downstream end thereof a nozzle opening operable to eject a polishing gas to the surface to be polished;
   a second tube, to be disposed adjacent to the surface to be polished, having an opening to eject inert gas or inactivating gas to the surface; and
   a third tube having an opening operable to exhaust a reactive product of the polishing gas and the inert gas or inactivating gas,
   wherein said first tube, said second tube and said third tube are disposed coaxially.

6. A nozzle device for use in gaseous polishing of a surface of an object, said nozzle device comprising:
   a nozzle body having at a downstream end thereof a nozzle opening operable to eject a polishing gas to the surface to be polished;
   an elevator having a support shaft connected to said nozzle body, said elevator being operable to position said nozzle body at a specific height above the surface of the object;
   an x-y table operable to position a local target area of the surface to be polished to a position below said nozzle opening; and
   an electromagnetic valve provided at the downstream end of said nozzle body, said electromagnetic valve being operable to allow ejection therefrom of the polishing gas and to stop the ejection,
   wherein the polishing gas is ejected in pulses by controlling said electromagnetic valve, instead of in a continuous stream.

7. A nozzle device as claimed in claim 6, wherein said nozzle body has therein a gas passage from an upstream end of said nozzle body to said nozzle opening.

8. A nozzle device as claimed in claim 6, wherein said nozzle body comprises a tube member to be directed to the surface to be polished.

9. A nozzle device as claimed in claim 8, wherein an upstream end of said tube member is provided with a header section.

10. A nozzle device as claimed in claim 6, further comprising a gas reservoir upstream of said nozzle body, said gas reservoir being operable to store the polishing gas at a specified pressure.

11. A nozzle device as claimed in claim 6, further comprising a gas ejection control device operable to control the ejection of the polishing gas to be in the form of pulsed ejections.

12. A nozzle device as claimed in claim 11, further comprising a parameter selection device operable to issue commands to said gas ejection control device regarding duration and frequency of the pulsed ejections.

13. A nozzle device as claimed in claim 11, further comprising an exhaust passage operable to remove excess polishing gas to prevent polishing of an area other than the local target area.

14. A gaseous polishing apparatus for polishing a local target area on a surface of an object, said gaseous polishing apparatus comprising:

a nozzle body having at a downstream end thereof a nozzle opening operable to eject a polishing gas to the surface of the object;

an elevator operable to position said nozzle opening of said nozzle body at a specific height above the surface of the object;

an x-y table operable to position the local target area of the surface to be polished at a position below said nozzle opening;

an electromagnetic valve provided at the downstream end of said nozzle body, said electromagnetic valve being operable to allow ejection therefrom of the polishing gas and to stop the ejection;

a gas supply device operable to supply the polishing gas to said nozzle body; and a gas ejection control device operable to control ejection of the polishing gas, wherein the polishing gas is ejected in pulses by controlling said electromagnetic valve, instead of in a continuous stream.

15. A gaseous polishing apparatus as claimed in claim 14, further comprising a film thickness measuring device operable to produce data of fine surface structures or irregularities of the surface of the object.

16. A gaseous polishing apparatus as claimed in claim 14, wherein said nozzle body has therein a gas passage from an upstream end of said nozzle body to said nozzle opening.

17. A gaseous polishing apparatus as claimed in claim 14, wherein said nozzle body comprises a tube member to be directed to the surface to be polished.

18. A gaseous polishing apparatus as claimed in claim 14, wherein an upstream end of said tube member is provided with a header section.

19. A gaseous polishing apparatus as claimed in claim 14, further comprising a gas reservoir upstream of said nozzle body, said gas reservoir being operable to store the polishing gas at a specified pressure.

20. A gaseous polishing apparatus as claimed in claim 14, further comprising a parameter selection device operable to issue commands to said gas ejection control device regarding duration and frequency of the pulsed ejections.

21. A gaseous polishing apparatus as claimed in claim 14, further comprising an exhaust passage being operable to remove excess polishing gas to prevent polishing of an area other than the local target area.

* * * * *